(12) United States Patent
Ohmaru

(10) Patent No.: US 9,007,816 B2
(45) Date of Patent: Apr. 14, 2015

(54) MEMORY CIRCUIT AND MEMORY DEVICE

(71) Applicant: Semiconductor Energy Laboratory Co., Ltd., Atsugi-shi, Kanagawa-ken (JP)

(72) Inventor: Takuro Ohmaru, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 196 days.

(21) Appl. No.: 13/683,257

(22) Filed: Nov. 21, 2012

(65) Prior Publication Data

US 2013/0135943 A1    May 30, 2013

(30) Foreign Application Priority Data

Nov. 25, 2011   (JP) ................................. 2011-256890

(51) Int. Cl.
  G11C 11/00      (2006.01)
  *G11C 7/12*     (2006.01)
  *G11C 11/412*   (2006.01)
  G11C 11/419     (2006.01)

(52) U.S. Cl.
  CPC ............... *G11C 7/12* (2013.01); *G11C 11/419* (2013.01); *G11C 11/412* (2013.01)

(58) Field of Classification Search
  CPC ............................ G11C 11/412; G11C 11/419
  USPC .................................................. 365/154, 156
  See application file for complete search history.

(56) References Cited

U.S. PATENT DOCUMENTS

| 5,731,856 A  | 3/1998 | Kim et al.      |
|--------------|--------|-----------------|
| 5,744,864 A  | 4/1998 | Cillessen et al.|
| 6,294,274 B1 | 9/2001 | Kawazoe et al.  |
| 6,556,475 B2 | 4/2003 | Yamazaki et al. |
| 6,563,174 B2 | 5/2003 | Kawasaki et al. |
| 6,693,616 B2 | 2/2004 | Koyama et al.   |

(Continued)

FOREIGN PATENT DOCUMENTS

| JP | 63-210022 A | 8/1988 |
|----|-------------|--------|
| JP | 63-210023 A | 8/1988 |

(Continued)

OTHER PUBLICATIONS

Asakuma. N. et. al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Vu Le
(74) *Attorney, Agent, or Firm* — Fish & Richardson P.C.

(57) ABSTRACT

To reduce power consumption, a memory circuit includes a latch unit in which first data and second data are rewritten and read in accordance with a control signal, a first switch unit that controls rewrite and read of the first data stored in the latch unit by being turned on or off in response to the control signal, and a second switch unit that controls rewrite and read of the second data stored in the latch unit by being turned on or off in response to the control signal. The latch unit includes a first inverter and a second inverter. At least one of the first inverter and the second inverter includes a first field-effect transistor, and a second field-effect transistor that has the same conductivity type as the first field-effect transistor and has a gate potential controlled in accordance with the control signal.

21 Claims, 13 Drawing Sheets

(56) References Cited

U.S. PATENT DOCUMENTS

| | | |
|---|---|---|
| 6,727,522 B1 | 4/2004 | Kawasaki et al. |
| 6,909,411 B1 | 6/2005 | Yamazaki et al. |
| 6,975,298 B2 | 12/2005 | Koyama et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,151,511 B2 | 12/2006 | Koyama |
| 7,158,157 B2 | 1/2007 | Yamazaki et al. |
| 7,211,825 B2 | 5/2007 | Shih et al |
| 7,224,339 B2 | 5/2007 | Koyama et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,557,801 B2 | 7/2009 | Ozaki |
| 7,674,650 B2 | 3/2010 | Akimoto et al. |
| 7,696,952 B2 | 4/2010 | Kimura et al. |
| 7,732,819 B2 | 6/2010 | Akimoto et al. |
| 8,144,501 B2 * | 3/2012 | Chen et al. ............... 365/154 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0076282 A1 | 4/2003 | Ikeda et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0158926 A1 * | 7/2006 | Yokoyama ............... 365/154 |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0170028 A1 | 7/2008 | Yoshida |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0116279 A1 * | 5/2009 | Maeda et al. ............... 365/154 |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0121878 A1 | 5/2011 | Kato et al. |
| 2011/0148463 A1 | 6/2011 | Kato et al. |
| 2011/0187410 A1 | 8/2011 | Kato et al. |
| 2011/0249487 A1 | 10/2011 | Saito et al. |
| 2012/0033510 A1 | 2/2012 | Nagatsuka et al. |
| 2012/0250397 A1 | 10/2012 | Ohmaru |
| 2012/0250407 A1 | 10/2012 | Kurokawa |
| 2012/0269013 A1 | 10/2012 | Matsuzaki |
| 2012/0292680 A1 | 11/2012 | Nagatsuka et al. |

FOREIGN PATENT DOCUMENTS

| | | |
|---|---|---|
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 07-282584 A | 10/1995 |
| JP | 60-198861 A | 10/1995 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 2/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | WO-2004/114391 | 12/2004 |
| JP | 1737044 A | 12/2006 |
| JP | 2009-110594 A | 5/2009 |
| JP | 2226847 A | 9/2010 |

OTHER PUBLICATIONS

Asaoka.Y et at, "29.1:Polarizerfree Reflective LCD Combined With Ultra Low-Power Driving Technology", SID Digest '09: SID International Symposium Digest of Technical Papers, May 31, 2009, pp. 395-398.

Chern.H et at, "An Analytical Model for the Above-Threshold Characteristics of Polysilicon Thin-Film Transistors", IEEE Transactions on Electron Devices, Jul. 1, 1995. vol. 42. No. 7, pp. 1240-1246.

Cho.D et at, "21.2: Al and SN-Doped Zinc Indium Oxide Thin Film Transistors for Amoled Back-Plane", SID Digest '09: SID International Symposium: Digest of Technical Papers, May 31, 2009, pp. 280-283.

Clark.S et al.. "First Principles Methods Using Castep", Zeishrift fur

(56) References Cited

OTHER PUBLICATIONS

Kristallographie 2005, vol. 220, pp. 567-570.

Coates.D et at, "Optical Studies of the Amorphous Liouid-Cholesteric Liquid Crystal Transition: "The Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1994, vol. 29, No. 5, pp. 2957-2959.

Demboh et at, "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZNO Thin-Film Transistors Produced at Room Temperature", Appl. Phys. Lett. (Applied Physics Letters), Sep. 27, 2004. vol. 56, No. 13, pp. 2541-2543.

Fung.T et al. "2-D Numerical Simulation of High Performance Amorphous In-Ga-Zn-O TFTs for Flat Panel Displays", AM-FPD '08 Digest of Technical Papers, Jul. 2, 2008, pp. 251-252, The Japan Society of Applied Physics.

Godo.H et at., "P-9: Numerical Analysis on Temperature Dependence of Characteristics of Amorphous In-Ga-Zn-Oxide TFT", SID Digest 99: SID International Symposium Digest of Technical Papers, May 31, 2009, pp. 1110-1112.

Godo.H: et .M., "Temperature Dependence of Characteristics and Electronic Structure for Amorphous In-Ga-Zn-Oxide TFT", AM-FPD '09 Digest of Technical Papers. Jul. 1, 2009, pp. 41-44.

Hayashi.R et al., "42.1: Invited Paper: Improved Amorphous In-Ga-Zn-O TFTS", SID Digest '08 : SID International Symposium Digest of Technical Papers, May 20, 2008, vol. 39, pp. 621-624.

Hirao.T et al, "Novel Top-Gate Zinc Oxide Then-Film Transistors (MO TFTS) for AMLCDS". J. Soc. Inf. Display (Journal of the Society for Information Display), 2007, vol. 15, No. 1, pp. 17-22.

Hosono.H et. al., "Working hypothesis to explore novel wide brand gap electrically conducting amorphous oxides and examples", J. Non-Cryst. Solids (Journal of Non-Crystalline Solids), 1996, vol. 198-200, pp. 165-160.

Hosono.H. "68.3: Invited Paper: Transparent Amorphous Oxide Semiconductors for High Performance TFT", SID Digest '07 :SID International Symposium Digest of Technical Papers, 2007, vol. 38, pp. 1830-1833.

Hsieh.H et al., "P-29: Modeling of Amorphous Oxide Semiconductor Thin Film Transistors and Subgap Density of States", SID Digest '08: SID International Symposium Digest of Technical Papers, May 20, 206, vol. 39, pp. 1277-1280.

Ikeda.T et .M., "Full-Functional System Liquid Crystal Display Using CG-Silicon Technology", SID Digest '64 :. SID International Symposium Digest of Technical Papers, 2004, vol. 35, pp. 860-883.

Janotti.A et al, "Native Point Defects in ZnO", Phys. Rev. B Physical Review. B), Oct. 4, 2007, vol. 76, No. 16, pp. 185202-1-185202-22.

Janotti.A et al., "Oxygen Vacancies in ZnO", Appl. Phys. Lett. (Applied Physics Letters), 2005. vol. 87, pp. 122102-1-122102-3.

Jeong.J: et at, "3.1: Distinguished Paper: 12.1-Inch WXGA AMOLED Display Driven by Indium-Galen-Zinc Oxide TFTS Array", SID Digest '08: SID International Symposium: Digest of Technical Papers, May 20, 2008, vol. 39, No. 1, pp. 1-4.

Jin.D et al., "65.2: Distinguished Paper: World-Largest (6.5') Flexible Full Color Top Emission AMOLED Display on Plastic Film and Its Bending Properties". SID Digest '09 : SID International Symposium: Digest of Technical Papers, May 31, 2009, pp. 983-985.

Kanno.H et at, "White Stacked Electrophospi-Iorecent Organic Light-Emitting Devices Employing MOO3 As a Charge-Generation Layer", Adv. Mater. (Advanced Materials), 2996, vol. 18, No. 3, pp. 339-342.

Kikuchi.H et al., "39.1: Invited Paper: Optically Isotropic Nano-Structured Liquid Crystal Composites for Display Applications", SID Digest '991 SID International Symposium Digest of Technical Papers, May 31, 2009, pp. 578-581.

Kiklichi.H et .al, "622:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuio.N. el at, "Spinel,YBFE204, and Y52FE307 Types of Structures for Compounds in the IN203 and SC203-4203-BO Systems [A; Fe, Ga, or Al; B: Mg, Mn, Fe, Ni, Cu, or Zn] at Temperatures Over 1000°C", Journal of Solid State Chemistry, 1986, vol. 80, pp. 382-384.

Kimizuka.N. et. al., "Syntheses and Single-Crystal Data of Homologous Compounds, $In_2O_3(ZnO)m$ (m=3, 4, and 5), $InGaO_3,(ZnO)3$, and $Ga_2O_3(ZnO)m$ (m=7, 8, 9, and 16) in the $In_2O_3$-$ZnGa_2O_4$-$ZnO$ System", Journal of Solid State Chemistry, Apr. 1, 1995, vol. 116, No. 1, pp. 170-178.

Kitzerow.H at al., "Observation of Blue Phases in Chiral Networks", Liquid Crystals, 1993, vol. 14, No. 3, pp. 911-916.

Kurokaima.-Y at al, "UHF RFCPUS on Flexible and Glass Substrates for Secure RFIO Systems", Journal of Solid-State Circuits, 2008, vol. 43, No. 1, pp. 292-296.

Lany.S et al., "Dopability, Intrinsic Conductivity, and Nonstaichiconetry of Transparent Conducting Oxides", Phys. Rev. Lett. (Physical Review Letters), Jan. 26, 2007, vol. 98, pp. 045501-1-045501-4.

Lee.H at .al, "Current Status of, Challenges to, and Perspective View of AM-OLED ", IDW '06: Proceedings of the 13th International Display Workshops, Dec. 7, 2006. pp. 663-666.

Lee.J at al. "World's Largest (15-Inch) XGA AMLCD Panel Using IGZO Oxide TFT", SID Digest '08: SID International Symposium Digest of Technical Papers, May 20, 2008, vol. 39, pp. 625-628.

Leen at al, "15.4:Excellent Performance of Indium-Oxide-Based Thin-Film Transistors by DC, Sputtering", SID Digest '09 : SID International Symposium Digest of Technical. Papers, May 31, 2000, pp. 191-163.

Li.C at al., "Modulated Structures of Homologous Compounds $In4O3(ZnO)m$ (M=In,Ga; m=Integer) Described by Four-Dimensional Superspace Group", Journal of Solid State Chemistry, 1995, vol. 139, pp. 347-358.

Masuda.S at al, "Transparent thin film transistors using ZnO as an active channel layer and their electrical properties", J. Appl. Phys. (Journal of Applied Physics) Feb. 1, 2003, vol. 93, No. 3, pp. 1624-1630.

Meiboom.S at al, "Theory of the Blue Phase of Cholesteric Liquid Crystals", Phys. Rev. Lett. Phyiscal Review Letters), May 4, 1981, vol. 46, No. 16, pp. 1216-1219.

Miyasaka.M. "Suftla Flexible Microelectronics on their Way to Business", SID Digest '07: SID International Symposium Digest of Technical Papers, 2007, vol. 38, pp. 1673-1676.

Mo .Y at al, "Amorphous Oxide TFT Backplanes for Large Size Amoled Displays", IDW '08 : Proceedings of the 6th International Display Workshops, Dec. 3, 2008, pp. 681-584.

Nakamura.M et. al., "The phase relations in the $In_2O_3$-$GaZZnO_4$-ZnO system at 1350°C", Journal of Solid State Chemistry, Aug. 1, 1991, vol. 93, No. 2, pp. 298-315.

Nakamuram, "Synthesis of Homologous Compound with New Long-Period Structure", Nirim Newsletter, Mar. 1, 1995, vol. 150, pp. 1-4.

Nomura.K et at, "Amorphous Oxide Semiconductors for High-Performance Flexible Thin-Film Transistors", JPN. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline $InGaO_3(ZnO)5$ films", Appl. Phys. Lett. (Applied Physics Letters) , Sep. 13, 2004, vol. 85, No. 11 , pp. 1993-1995.

Nomura.K et at, "Room-Temperature Fabrication of Transparent Flexible Thin-Film Transistors Using Amorphous Oxide Semiconductors", Nature, Nov. 25, 2004, vol. 432, pp. 488-492.

Nomura.K et al. "Thin-Film Transistor Fabricated in Single-Crystalline Transparent Oxide Semiconductor", Science, May 23, 2003, vol. 300, No. 5823, pp, 1269-1272.

(56) References Cited

OTHER PUBLICATIONS

Nowatarl.H , "60.2: Intermediate Connector With Suppressed Voltage Loss for White Tandem Oleds", SID Digest '09 : SID: International Symposium Digest of Technical Papers, May 31, 2009, vol. 40, pp. 899-902.

Oba.F et al, "Defect energetics in ZnO: a Hybrid Harbw-Fock density functional study", Phys. Rev. B (Physical Review. B), 2008, vol. 77, pp. 245202-1-245202-6.

Ohm et al., "Improving the Gate Stability of ZnO Thin-Film Transistors With Aluminum Oxide Dielectric Layers", J. Electrochem. Soc. (Journal of the Electrochemical Society), 2009, vol. 155, No. 12, pp. H1009-H1014.

Ohara.H et al.. "213:4.8 IN. OVGA Amoled Display Using In-Ga-Zn-Oxide TFTS With a Novel Passivation Layer", SID Digest 3)9: SID International Syiyiposium Digest of Technical Papers, May 31. 2009, pp. 284-257.

Ohara.H at al., "Amorphous In-Ga-Zn-Oxide TFTs with Soppeessed Variation for 4.0 inch OVGA AMOLED Display", AM-FPD '09 Digest of Technical Papers, Jul. 1, 2009, pp. 227-210, The Japan Society of Applied Physics.

Oritam at al., "Amorphous transparent conductive oxide InGaO3(ZnO)m (m<4):a Zn4s conductor", Philosophical Magazine, 2001, vol. 81. No. 5, pp. 501-515.

Orita.M at al., "Mechanism of Electrical Conductivity of Transparent InGaZnO4", Phys. Rev. B (Physical Review. B), Jan. 15, 2000, vol. 61, No. 3. pp. 1811-1816.

Osada.T at al., "15:2: Development of Driver-Integrated Panel using Amorphous In-Ga-Zn-Oxide TFT", SID Digest '09: SID International Symposium Digest of Technical Papers, May 31, 2009, pp. 164- 187.

Osada.T at at "Development of Driver-Integrated Panel Using Amorphous In-Ga-Znoxide TFT", AM-FPD '09 Digest of Technical Papers., Jul. 1, 2009, pp. 33-36.

Park.J at at, "Amorphous Indium-Gallium-Zinc Oxide TFTS and Their Application for Large Size Amoled", AM-FPD '08 Digest of Technical Papers, Jul. 2, 2005, pp. 275-278.

Parx.3 at ai.. "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J at at., "Electronic Transport Semiconductor Upon Exposure Properties of Amorphous Indium-Gallium-Zinc Oxide Semiconductor upon Exposure to Water", Appl. Phys. Lett. (Applied Physics Letters), 2008, vol. 92, pp. 072104-1-072104-3.

Park.J et al., "High performance amorphous oxide thin Elm transistors with salt-aligned top-gate structure", IEDM 09: Technical Digest of International Electron Devices Meeting, Dec. 7, 2009, pp. 191-194.

Park.J at al.. "Improvements in the Device Characteristics of Amorphous: Indium Gallium Zinc Oxide Thin-Film Transistors by ArPlasma Treatment", Appl. Phys. Lett. (Applied Physics Letters), Jun. 26, 2007, vol. 90, No. 26, pp. 262106-1-262106-3.

Park.S et. al., "Challenge to Future Displays: Transparent AM-OLED Driven by Peald Grown ZnO TFT", IMID '07 Digest. 2007, pp. 1249-1252.

Park.Sang-Hee et al., "42.3: Transparent ZnO Thin Film Transistor for the Application of High Aperture Ratio Bottom Emission AM-OLED Display", SID Digest '08: SID International Symposium Digest of Technical Papers, May 20, 2008, vol. 39, pp. 629-632.

Prins.M. et al, "A Ferroelectric Transparent Thin-Film Transistor", Appl. Phys. Lett. (Applied Physics Letters), Jun. 17, 1996, vol. 68, No. 25, pp. 3650-3652.

Sakata.J. et al., "Development of 4.0-in. AMOLED Display With Driver Circuit Using Amorphous In-Ga-Zn-Oxide TFTS", IDW '09: Proceedings of the 16th International Display Workshops, 2009, pp. 689-692.

Son.K et al., "42.4L: Late-News Paper: 4 Inch OVGA AMOLED Driven by the Threshold Voltage Controlled Amorphous Gizo (Ga2O3-In2O3-ZnO) TFT", SID Digest '08: SID International Symposium Digest of Technical Papers, May 20, 2008, vol. 39, pp. 533-636.

Takahashi.M et al., "Theoretical Analysis of IGZO Transparent Amorphous Oxide Semiconductor", IDW '08: Proceedings of the 15th International Display Workshops, Dec. 3, 2008, pp. 1637-1640.

Tsuda.K of at, "Ultra Low Power Consumption Technologiesfor Mobile TFT-LCDs ", IDW '02: Proceedings of the 9th International Display Workshops, Dec. 4, 2002, pp. 295-298.

Ueno.K et al., "Field-Effect Transistor on SrTiO3 with Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

* cited by examiner

FIG. 1C1
Inv

FIG. 1C2
Inv

MEMORY CIRCUIT AND MEMORY DEVICE

BACKGROUND OF THE INVENTION

1. Field of the Invention

One embodiment of the present invention relates to a memory circuit. Further, one embodiment of the present invention relates to a memory device including a memory circuit.

2. Description of the Related Art

In recent years, devices including circuits composed of only transistors having the same conductivity type (also referred to as circuits composed of only n-channel transistors or p-channel transistors) have been developed.

An example of the circuit composed of only transistors having the same conductivity type is an inverter, which is a logic gate.

For example, when the mobility is very different between a p-channel transistor and an n-channel transistor that both include a channel formation region containing the same semiconductor material, it is difficult to constitute an inverter using these p-channel and n-channel transistors. In contrast, an inverter can be easily constituted of transistors having the same conductivity type.

An example of a device including the inverter is a memory circuit (e.g., Patent Document 1).

For example, a memory circuit disclosed in Patent Document 1 is a memory cell of static random access memory (SRAM). The memory circuit disclosed in Patent Document 1 includes two switching transistors and two inverters each of which is composed of only transistors having the same conductivity type.

REFERENCE

Patent Document 1: Japanese Published Patent Application No. H7-282584

SUMMARY OF THE INVENTION

A conventional memory circuit has a problem of large power consumption.

For example, in the memory circuit disclosed in Patent Document 1, current always flows between a source and a drain of the depletion transistor included in either inverter and leakage current flows even while data is held. As a result, power consumption is increased as the capacity of the SRAM is increased, for example.

Moreover, in the memory circuit disclosed in Patent Document 1, stored data is lost when supply of the power supply voltage stops. Accordingly, the power supply voltage needs to continue to be supplied at all times while data is held, which increases power consumption.

An object of one embodiment of the present invention is to reduce power consumption.

In one embodiment of the present invention, a memory circuit is constituted using an inverter composed of two field-effect transistors having the same conductivity type. One of the two field-effect transistors is a field-effect transistor in which the amount of current between a source and a drain is changed in response to a control signal. The above structure can reduce the leakage current in a hold period, for example.

According to one embodiment of the present invention, a memory circuit includes a latch circuit, a first switch unit, and a second switch unit. The latch unit has a function of storing first data and second data. The first data and the second data are rewritten into and read from the latch unit in accordance with a control signal. The first switch unit controls rewrite and read of the first data stored in the latch unit, by being turned on or off in response to the control signal. The second switch unit controls rewrite and read of the second data stored in the latch unit, by being turned on or off in response to the control signal. The latch unit includes a first inverter and a second inverter. The potential of an input terminal of the first inverter is the first data. The first inverter maintains a value of the second data in response to a potential of an output terminal of the first inverter. The potential of an input terminal of the second inverter is the second data. The second inverter maintains a value of the first data in response to a potential of an output terminal of the second inverter. At least one of the first inverter and the second inverter includes a first field-effect transistor and a second field-effect transistor. A gate of the first field-effect transistor serves as the input terminal of the inverter. The first field-effect transistor controls whether the potential of the output terminal of the inverter is set at a first potential or not in accordance with the potential of the input terminal of the inverter. The second field-effect transistor has the same conductivity type as the first field-effect transistor. The gate potential of the second field-effect transistor is controlled in accordance with the control signal. The second field-effect transistor controls whether the potential of the output terminal of the inverter is set at a second potential or not in accordance with the control signal.

In one embodiment of the present invention, the memory circuit may be constituted as a nonvolatile memory circuit by using transistors with low off-state current, for example, as all of field-effect transistors included in the latch unit, the first switch unit, and the second switch unit. Thus, the memory circuit can hold data even if supply of the power supply voltage to the memory circuit stops, for example.

According to one embodiment of the present invention, unwanted current flow in the memory circuit can be suppressed, so that power consumption can be reduced.

BRIEF DESCRIPTION OF THE DRAWINGS

In the accompanying drawings:

FIGS. 1A, 1B, 1C1, and 1C2 illustrate an example of a memory circuit;

FIG. 2 is a timing chart for explaining an example of the memory circuit;

DETAILED DESCRIPTION OF THE INVENTION

Examples of embodiments of the present invention will be described. Note that it will be readily appreciated by those skilled in the art that details of the embodiments can be modified without departing from the spirit and scope of the present invention. Thus, the present invention should not be limited to the description of the following embodiments, for example.

Note that the contents in different embodiments can be combined with one another as appropriate. In addition, the contents of the embodiments can be replaced with each other as appropriate.

Ordinals such as "first" and "second" are used in order to avoid confusion among components, and the number of components is not limited by the number of ordinals.

Embodiment 1

In this embodiment, an example of a memory circuit including an inverter composed of only transistors having the same conductivity type will be described with reference to FIGS. 1A, 1B, 1C1, and 1C2, FIG. 2, and FIGS. 3A and 3B.

Figure 1A:
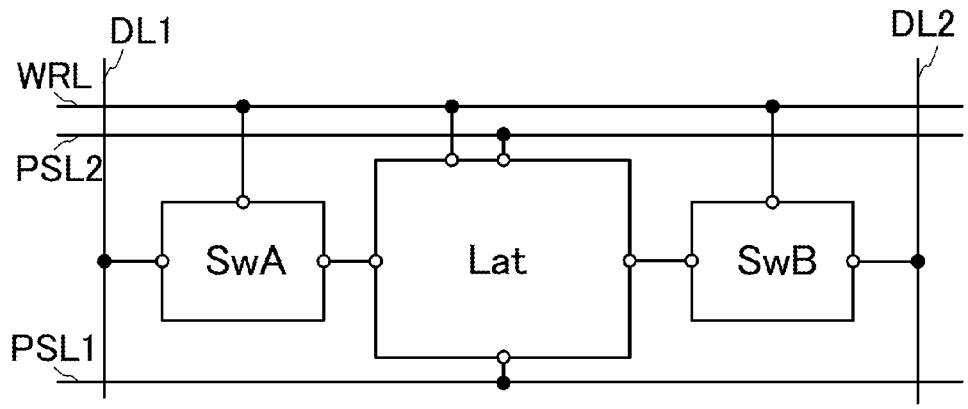

The memory circuit in this embodiment includes a latch unit Lat, a switch unit SwA, and a switch unit SwB, for example, as illustrated in FIG. 1A.

The latch unit Lat is supplied with the power supply voltage through a first power supply line PSL1 and a second power supply line PSL2. The latch unit Lat is also supplied with a control signal WR through a rewrite/read control signal line WRL. The latch unit Lat has a function of storing first data D1 and second data D2. The first data D1 and the second data D2 are rewritten and read in accordance with the control signal WR.

The switch unit SwA and the switch unit SwB are supplied with the control signal WR through the rewrite/read control signal line WRL.

The switch unit SwA has a function of controlling rewrite and read of the first data D1 in accordance with the control signal WR.

The switch unit SwB has a function of controlling rewrite and read of the second data D2 in accordance with the control signal WR.

Each of the switch units SwA and SwB has, for example, a field-effect transistor whose on/off state is controlled in accordance with the control signal WR.

Figure 1B:
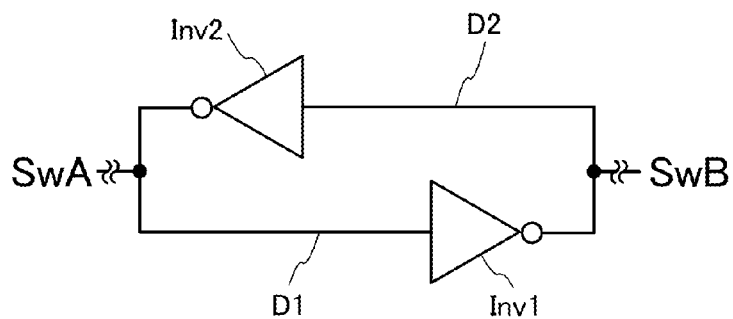
Figure 1B:
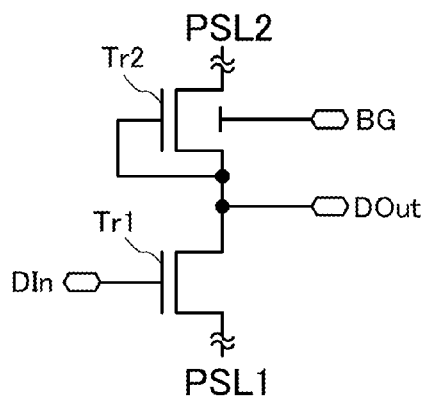
Figure 1B:
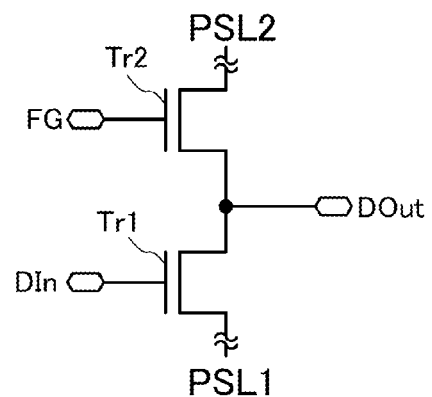

As illustrated in FIG. 1B, the latch unit Lat includes a first inverter Inv1 and a second inverter Inv2.

The potential of an input terminal of the first inverter Inv1 is the first data D1. The value of the second data D2 is maintained in response to the potential of an output terminal of the first inverter Inv1.

The potential of an input terminal of the second inverter Inv2 is the second data D2. The value of the first data D1 is maintained in response to the potential of an output terminal of the second inverter Inv2.

Figure 2:
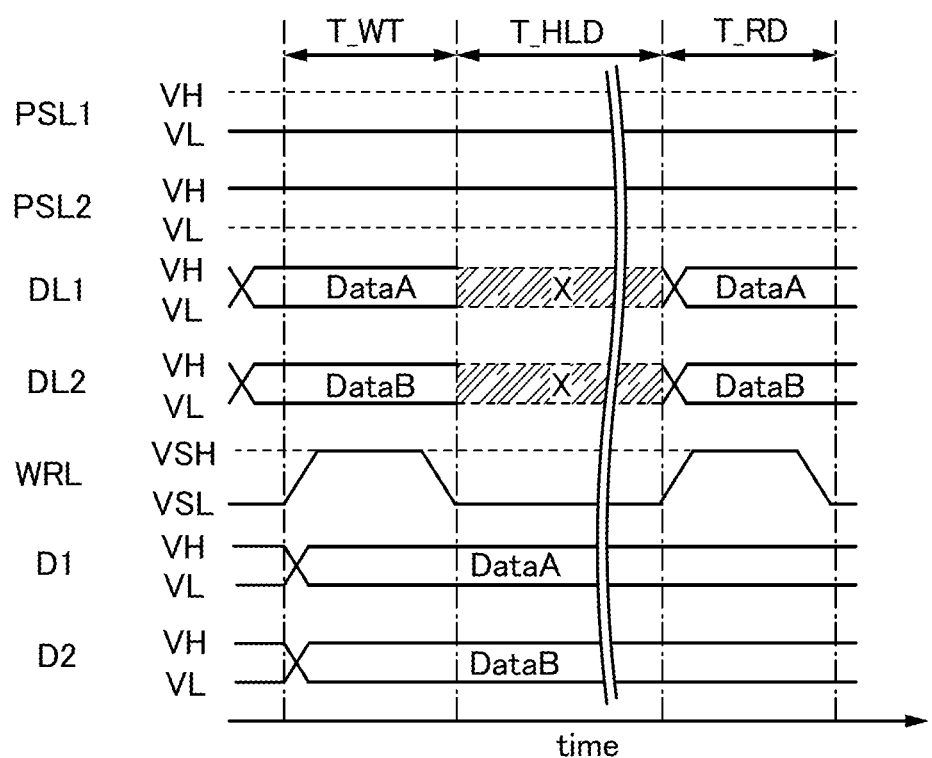

An inverter (also referred to as inverter Inv) that is at least one of the first inverter Inv1 and the second inverter Inv2 is composed of only transistors having the same conductivity type, and includes a first field-effect transistor Tr1 and a second field-effect transistor Tr2 as illustrated in FIGS. 1C1 and 1C2.

The potential of one of a source and a drain of the first field-effect transistor Tr1 is set based on the potential of the first power supply line PSL1. A gate of the first field-effect transistor Tr1 serves as an input terminal (also referred to as terminal DIn) of the inverter Inv. The first field-effect transistor Tr1 has a function of controlling whether the potential of an output terminal (also referred to as terminal DOut) of the inverter Inv is set at a first potential V1 in accordance with the potential of the input terminal (the terminal DIn) of the inverter Inv.

The second field-effect transistor Tr2 has the same conductivity type as the first field-effect transistor Tr1. The potential of one of a source and a drain of the second field-effect transistor Tr2 is set based on the potential of the second power supply line PSL2. The potential of a gate of the second field-effect transistor Tr2 is controlled in accordance with the control signal WR. The second field-effect transistor Tr2 has a function of controlling whether the potential of the output terminal (the terminal DOut) of the inverter Inv is set at a second potential V2.

Note that the levels of the first potential V1 and the second potential V2 are determined by the ratio of the amount of current flowing between the source and the drain of the first field-effect transistor Tr1 to the amount of current flowing between the source and the drain of the second field-effect transistor Tr2.

For example, the other of the source and the drain of the first field-effect transistor Tr1 illustrated in FIGS. 1C1 and 1C2 has the potential of the output terminal (the terminal DOut) of the inverter Inv. The gate of the first field-effect transistor Tr1 illustrated in FIGS. 1C1 and 1C2 has the potential of the input terminal (the terminal DIn) of the inverter Inv.

The other of the source and the drain of the second field-effect transistor Tr2 illustrated in FIGS. 1C1 and 1C2 is electrically connected to the other of the source and the drain of the first field-effect transistor Tr1.

The second field-effect transistor Tr2 illustrated in FIG. 1C1 has a pair of gates that overlap each other with a channel formation region placed therebetween. One of the pair of gates and the other of the source and the drain of the second field-effect transistor Tr2 illustrated in FIG. 1C1 are electrically connected to each other. The potential of the other of the pair of gates (also referred to as terminal BG) of the second field-effect transistor Tr2 illustrated in FIG. 1C1 is changed in response to the potential of the control signal WR.

The threshold voltage of the second field-effect transistor Tr2 is changed in response to the potential of the other of the pair of gates of the second field-effect transistor Tr2. For example, when the potential of the other of the pair of gates of the second field-effect transistor Tr2 increases, the threshold voltage of the second field-effect transistor Tr2 decreases. Thus, the potential of the other of the pair of gates of the second field-effect transistor Tr2 is changed in response to the potential of the control signal WR, whereby the threshold voltage of the second field-effect transistor Tr2 can be set in accordance with the on/off state of the switch unit SwA and the switch unit SwB to which the same control signals WR are input, and for example, the second field-effect transistor Tr2 can be set in a normally off state or a normally on state.

Note that the second field-effect transistor Tr2 does not necessarily have a pair of gates. For example, the second field-effect transistor Tr2 illustrated in FIG. 1C2 is a normal field-effect transistor, and the potential of a gate (also referred to as terminal FG) of the second field-effect transistor Tr2 is changed in response to the potential of the control signal WR.

The above is the description of the configuration example of the memory circuit in this embodiment.

Next, an example of a method for driving the memory circuit in this embodiment will be described with reference to a timing chart in FIG. 2. Here, the first inverter Inv1 and the second inverter Inv2 each have the configuration illustrated in FIG. 1C1, and all the field-effect transistors included in the memory circuit of this embodiment are n-channel transistors. The potential of a high-level signal is a potential VH, the potential of a low-level signal is a potential VL, and an undefined (don't care) value is represented by X. The potential of the first power supply line PSL1 is the potential VH, and the potential of the second power supply line PSL2 is the potential VL. A double wavy line in FIG. 2 represents omission.

In the example of a method for driving the memory circuit in this embodiment, first, the potentials of a first data signal line DL1 and a second data signal line DL2 are set in a rewrite period (also referred to as period T_WT). At this time, the potential of the first data signal line DL1 is set at DataA, and the potential of the second data signal line DL2 is set at DataB. One of DataA and DataB is a high-level potential and the other thereof is a low-level potential. The potential of the control signal WR is set at a potential VSH, whereby the potential of the rewrite/read control signal line WRL is set at the potential VSH. The potential VSH is higher than a ground potential and can be set as appropriate in accordance with the specifications of the memory circuit. In the case where one of DataA and DataB is data"1" and the other thereof is data"0", 1-bit data can be held in the memory circuit.

In the rewrite period, the switch unit SwA and the switch unit SwB are turned on, and DataA is written as the first data D1 and DataB is written as the second data D2 of the latch unit Lat.

In each of the first inverter Inv1 and the second inverter Inv2, the potential of the other of the pair of gates (the terminal BG) of the second field-effect transistor Tr2 is set in response to the potential of the control signal WR.

The case where the potential of DataA is a high-level potential (the potential VH) and the potential of DataB is a low-level potential (the potential VL) is shown below as an example.

In this case, in the first inverter Inv1, the first field-effect transistor Tr1 is turned on, and the amount of current flowing between the source and the drain of the second field-effect transistor Tr2 becomes smaller than the amount of current flowing between the source and the drain of the first field-effect transistor Tr1 in response to the control signal WR.

In the second inverter Inv2, the first field-effect transistor Tr1 is turned off, and the amount of current flowing between the source and the drain of the second field-effect transistor Tr2 becomes larger than the amount of current flowing between the source and the drain of the first field-effect transistor Tr1 in response to the control signal WR. Thus, the potential for the first data D1 can be set by both the switch unit SwA and the field-effect transistor Tr2 included in the second inverter Inv2. Accordingly, the speed for writing the first data D1 can be increased.

Then, in a hold period (also referred to as period T_HLD), the potential of the control signal WR is set at a potential VSL, whereby the potential of the rewrite/read control signal line WRL is set at the potential VSL. The potential VSL is lower than the potential VSH and is lower than or equal to a ground potential. The potential VSL can be set as appropriate in accordance with the specifications of the memory circuit.

At this time, the switch unit SwA and the switch unit SwB are turned off, and the first data D1 (DataA) and the second data D2 (DataB) written into the latch unit Lat are held by the first inverter Inv1 and the second inverter Inv2.

In each of the first inverter Inv1 and the second inverter Inv2, the second field-effect transistor Tr2 is turned off in response to the control signal WR. Consequently, leakage current does not flow in the first inverter Inv1 and the second inverter Inv2.

Then, in a read period (also referred to as period T_RD), the potential of the control signal WR is set at the potential VSH, whereby the potential of the rewrite/read control signal line WRL is set at the potential VSH.

At this time, the switch unit SwA and the switch unit SwB are turned on, and the potential of the first data signal line DL1 is set in response to DataA and the potential of the second data signal line DL2 is set in response to DataB. Thus, the first data D1 (DataA) and the second data D2 (DataB) stored in the latch unit Lat are read.

The case where the potential of DataA is a high-level potential (the potential VH) and the potential of DataB is a low-level potential (the potential VL) is shown below as an example.

In this case, in the first inverter Inv1, the first field-effect transistor Tr1 is turned on, and the amount of current flowing between the source and the drain of the second field-effect transistor Tr2 becomes smaller than the amount of current flowing between the source and the drain of the first field-effect transistor Tr1 in response to the control signal WR.

In the second inverter Inv2, the first field-effect transistor Tr1 is turned off, and the amount of current flowing between the source and the drain of the second field-effect transistor Tr2 becomes larger than the amount of current flowing between the source and the drain of the first field-effect transistor Tr1 in response to the control signal WR. Thus, in the read period, current flows between the source and the drain of the second field-effect transistor Tr2 in the second inverter Inv2, which enables deviation of the value of the first data D1 to be corrected in the read period even if the value of the first data D1 is changed in the hold period due to leakage current of another field-effect transistor, for example.

The case where the potential of DataA is a low-level potential (the potential VL) and the potential of DataB is a high-level potential (the potential VH) is explained below.

In this case, in the first inverter Inv1, the first field-effect transistor Tr1 is turned off, and the amount of current flowing between the source and the drain of the second field-effect transistor Tr2 becomes larger than the amount of current flowing between the source and the drain of the first field-effect transistor Tr1 in response to the control signal WR. Thus, in the read period, current flows between the source and the drain of the second field-effect transistor Tr2 in the first inverter Inv1, which enables deviation of the value of the second data D2 to be corrected in the read period even if the value of the second data D2 is changed in the hold period due to leakage current of another field-effect transistor, for example.

Further, in the second inverter Inv2, the first field-effect transistor Tr1 is turned on, and the amount of current flowing between the source and the drain of the second field-effect transistor Tr2 becomes smaller than the amount of current flowing between the source and the drain of the first field-effect transistor Tr1 in response to the control signal WR.

The above is the description of the example of the method for driving the memory circuit in this embodiment.

The memory circuit in this embodiment may be a nonvolatile memory circuit that can hold the first data D1 and the second data D2 even when supply of power stops. For example, a nonvolatile memory circuit can be formed by using field-effect transistors with low off-state current as all the field-effect transistors included in the latch unit Lat, the switch unit SwA, and the switch unit SwB. An example of a field-effect transistor with low off-state current is a field-effect transistor using a material with a bandgap wider than that of silicon. In this case, the off-state current of the field-effect transistor per channel width of 1 μm is preferably 1 zA or less.

Figure 3A:
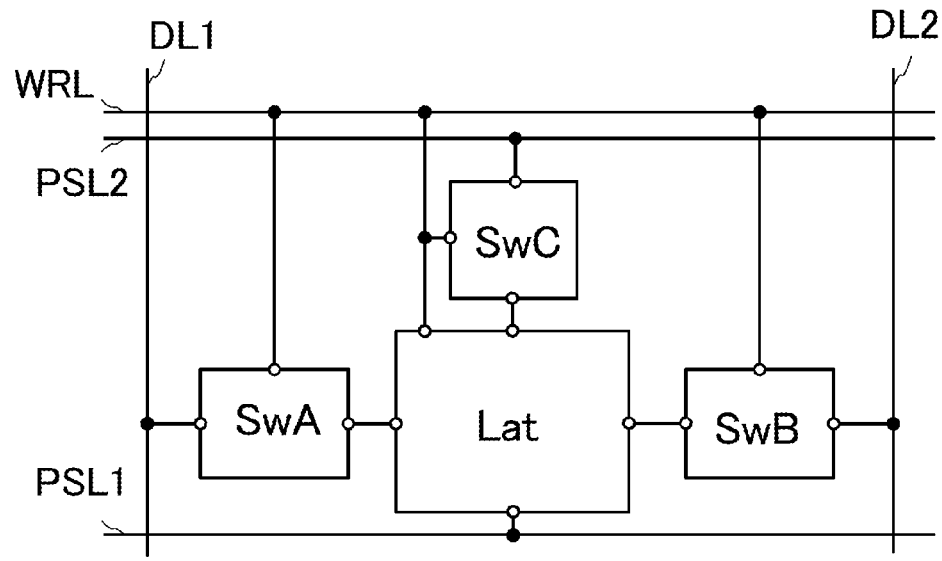
FIGS. 3A and 3B each illustrate an example of a memory circuit.
Figure 3B:
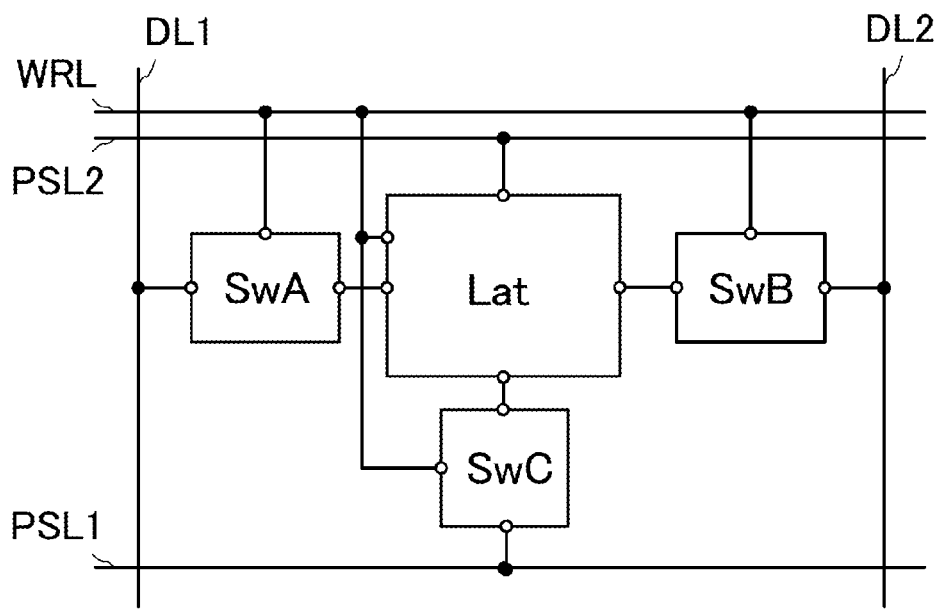

When field-effect transistors with low off-state current are used as all the field-effect transistors included in the latch unit Lat, the switch unit SwA, and the switch unit SwB, a switch unit SwC may be provided in the memory circuit as illustrated in FIGS. 3A and 3B.

The switch unit SwC is supplied with the control signal WR through the rewrite/read control signal line WRL. The switch unit SwC has a function of controlling whether to supply the power supply voltage to the latch unit Lat by being turned on or off in response to the control signal WR.

For example, in the case where a potential applied to the second power supply line PSL2 is higher than a potential applied to the first power supply line PSL1, the switch unit SwC is provided between the second power supply line PSL2 and the latch unit Lat as illustrated in FIG. 3A. Thus, whether the potential of the second power supply line PSL2 is supplied to the latch unit Lat can be controlled in accordance with the control signal WR.

For example, in the case where a potential applied to the first power supply line PSL1 is higher than a potential applied to the second power supply line PSL2, the switch unit SwC is provided between the first power supply line PSL1 and the latch unit Lat as illustrated in FIG. 3B. Thus, whether the potential of the first power supply line PSL1 is supplied to the latch unit Lat can be controlled in accordance with the control signal WR.

The configuration is not limited to those described above, and the switch unit SwC may be provided both between the first power supply line PSL1 and the latch unit Lat and between the second power supply line PSL2 and the latch unit Lat.

The switch unit SwC has a field-effect transistor, for example.

Providing the switch unit SwC makes it possible to hold a potential to be the power supply voltage in the memory circuit even if supply of the power supply voltage to the memory circuit stops.

The above is the description of the configuration examples of the memory circuit in this embodiment.

As has been described with FIGS. 1A, 1B, 1C1, and 1C2, FIG. 2, and FIGS. 3A and 3B, in the memory circuit according to one example of this embodiment, the inverter composed of only transistors having the same conductivity type in the latch unit is formed using a field-effect transistor, a gate potential of which is controlled in accordance with a control signal. Thus, the field-effect transistor can be in a normally off state during a non-operating period such as the hold period. Consequently, leakage current of the inverter in the non-operating period can be reduced, and as a result, power consumption of the memory circuit can be reduced. Further, a control signal used for controlling the first switch unit and the second switch unit also controls the inverter, whereby the number of signals used in the memory circuit can be decreased.

In addition, the memory circuit according to one example of this embodiment is a nonvolatile memory circuit, in which case data written into the latch unit can be held even if supply of the power supply voltage to the memory circuit stops. Accordingly, power consumption can be reduced, for example, by stopping supply of the power supply voltage to the memory circuit while data is not rewritten or read.

Embodiment 2

In this embodiment, as a specific example of the memory circuit described in Embodiment 1, a memory circuit consti-tuted only of n-channel field-effect transistors will be described with reference to FIGS. 4A and 4B, FIGS. 5A and 5B, FIGS. 6A and 6B, FIGS. 7A and 7B, and FIG. 8. Note that the description of the memory circuit in Embodiment 1 can apply to the same portions as in Embodiment 1 as appropriate.

Figure 4A:
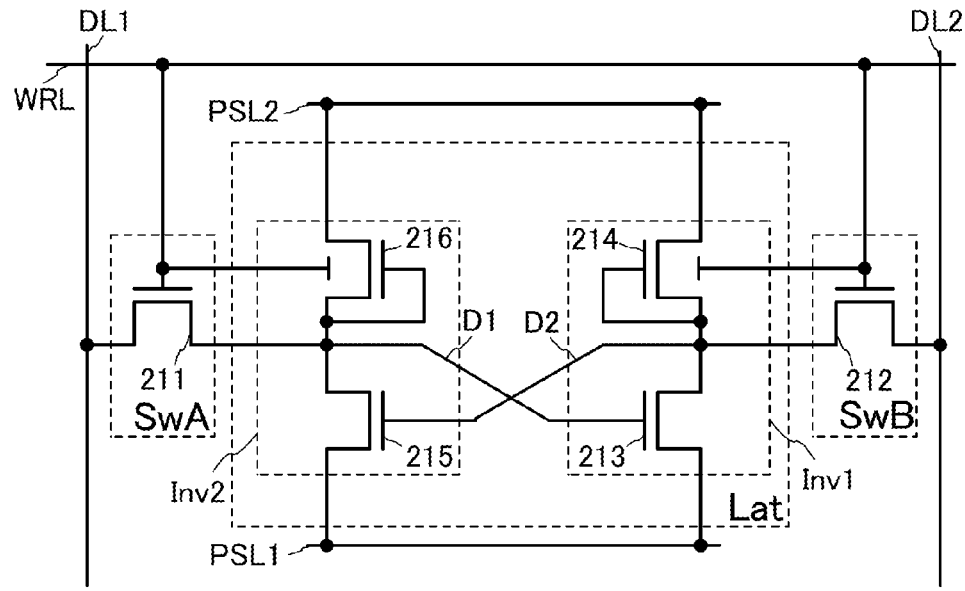
FIGS. 4A and 4B each illustrate an example of a memory circuit.

FIG. 4A illustrates an example of a memory circuit in this embodiment. The memory circuit illustrated in FIG. 4A includes the latch unit Lat, the switch unit SwA, and the switch unit SwB.

The switch unit SwA has a field-effect transistor 211.

One of a source and a drain of the field-effect transistor 211 is electrically connected to the first data signal line DL1. A gate of the field-effect transistor 211 is electrically connected to the rewrite/read control signal line WRL.

The switch unit SwB has a field-effect transistor 212.

One of a source and a drain of the field-effect transistor 212 is electrically connected to the second data signal line DL2. A gate of the field-effect transistor 212 is electrically connected to the rewrite/read control signal line WRL.

The latch unit Lat includes the first inverter Inv1 and the second inverter Inv2.

The first inverter Inv1 includes a field-effect transistor 213 and a field-effect transistor 214.

One of a source and a drain of the field-effect transistor 213 is electrically connected to the first power supply line PSL1. The first power supply line PSL1 is supplied with the potential VL. A gate of the field-effect transistor 213 is electrically connected to the other of the source and the drain of the field-effect transistor 211.

One of a source and a drain of the field-effect transistor 214 is electrically connected to the second power supply line PSL2. The second power supply line PSL2 is supplied with the potential VH. The other of the source and the drain of the field-effect transistor 214 is electrically connected to the other of the source and the drain of the field-effect transistor 213. The field-effect transistor 214 has a pair of gates that overlap each other with a channel formation region placed therebetween. One of the pair of gates and the other of the source and the drain of the field-effect transistor 214 are electrically connected to each other. The other of the pair of gates of the field-effect transistor 214 is electrically connected to the rewrite/read control signal line WRL.

The second inverter Inv2 includes a field-effect transistor 215 and a field-effect transistor 216.

One of a source and a drain of the field-effect transistor 215 is electrically connected to the first power supply line PSL1. The other of the source and the drain of the field-effect transistor 215 is electrically connected to the gate of the field-effect transistor 213. A gate of the field-effect transistor 215 is electrically connected to the other of the source and the drain of the field-effect transistor 212 and the other of the source and the drain of the field-effect transistor 213. Note that the potential of a portion where the other of the source and the drain of the field-effect transistor 215 and the gate of the field-effect transistor 213 are connected to each other is called the first data D1. Note also that the potential of a portion where the other of the source and the drain of the field-effect transistor 213 and the gate of the field-effect transistor 215 are connected to each other is called the second data D2.

One of a source and a drain of the field-effect transistor 216 is electrically connected to the second power supply line PSL2. The other of the source and the drain of the field-effect transistor 216 is electrically connected to the other of the source and the drain of the field-effect transistor 215. The field-effect transistor 216 has a pair of gates that overlap each other with a channel formation region placed therebetween. One of the pair of gates and the other of the source and the drain of the field-effect transistor 216 are electrically connected to each other. The other of the pair of gates of the field-effect transistor 216 is electrically connected to the rewrite/read control signal line WRL.

Note that the timing at which the control signal WR is input to the gate of each of the field-effect transistors 211 and 212 may be later than the timing at which the control signal WR is input to the other of the pair of gates of each of the field-effect transistors 214 and 216. Accordingly, even if the value of the first data D1 or the second data D2 in the latch unit Lat is changed during the hold period, for example, current flows between the source and the drain of the field-effect transistors 214 and 216 in the read period and the value of the first data D1 or the second data D2 is corrected, and then the field-effect transistors 211 and 212 are turned on, whereby the first data D1 and the second data D2 can be read. The timing of inputting the control signal WR can be changed, for example, by providing a delay circuit between the gate of the field-effect transistor 211 and the rewrite/read control signal line WRL and between the gate of the field-effect transistor 212 and the rewrite/read control signal line WRL.

Figure 4B:
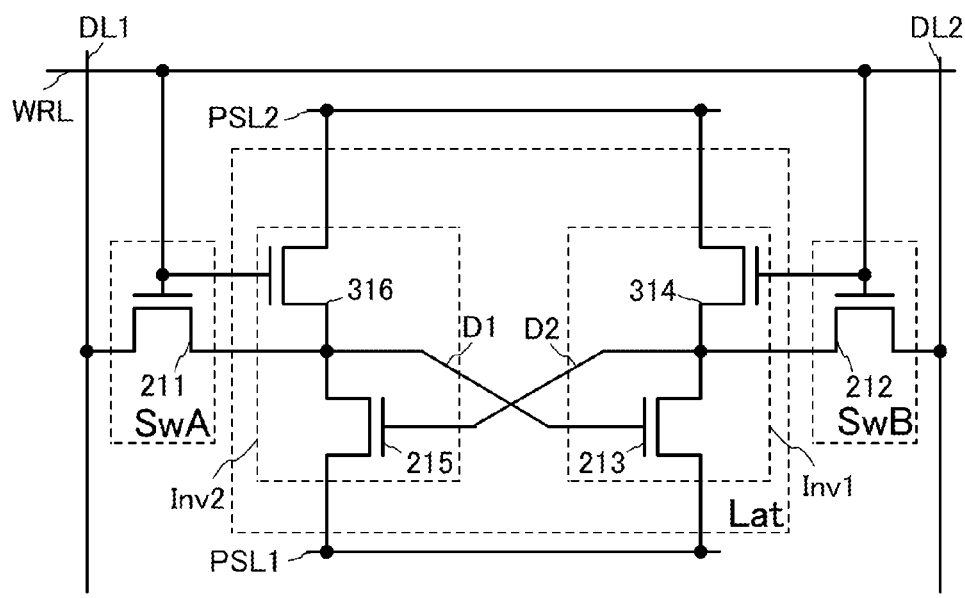

Alternatively, as illustrated in FIG. 4B, a field-effect transistor 314 that is a normal field-effect transistor may be used instead of the field-effect transistor 214 illustrated in FIG. 4A, and a field-effect transistor 316 that is a normal field-effect transistor may be used instead of the field-effect transistor 216.

In this case, one of a source and a drain of the field-effect transistor 314 is electrically connected to the second power supply line PSL2. The other of the source and the drain of the field-effect transistor 314 is electrically connected to the other of the source and the drain of the field-effect transistor 213. A gate of the field-effect transistor 314 is electrically connected to the rewrite/read control signal line WRL.

In addition, one of a source and a drain of the field-effect transistor 316 is electrically connected to the second power supply line PSL2. The other of the source and the drain of the field-effect transistor 316 is electrically connected to the other of the source and the drain of the field-effect transistor 215. A gate of the field-effect transistor 316 is electrically connected to the rewrite/read control signal line WRL.

A nonvolatile memory circuit can be constituted by using transistors with low off-state current as the field-effect transistors 211 to 216 and the field-effect transistors 314 and 316. As a transistor with low off-state current, a transistor using a material with a bandgap wider than that of silicon can be used, for example.

Figure 5A:
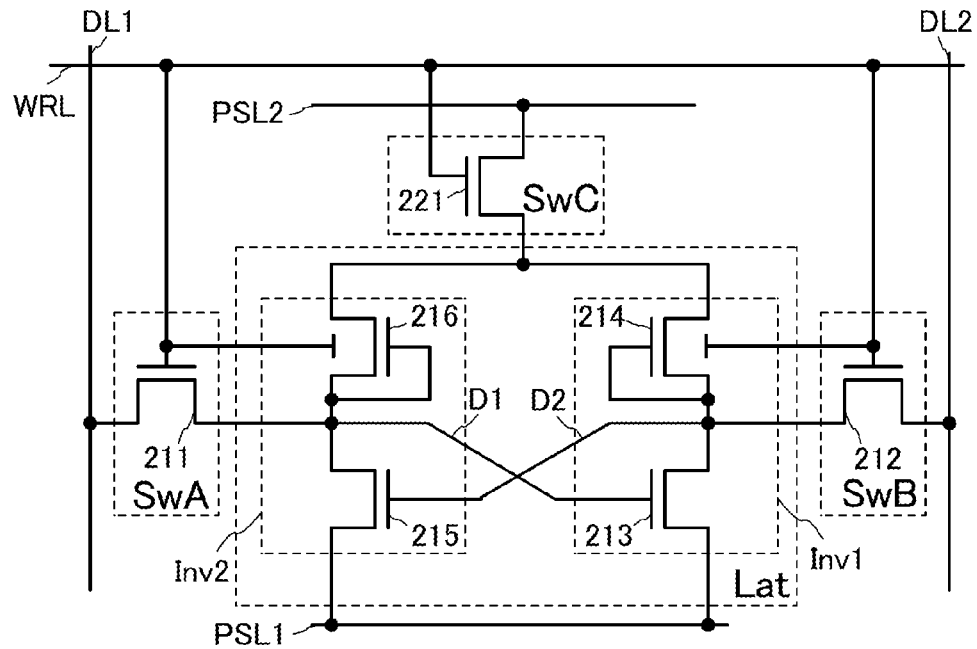
FIGS. 5A and 5B each illustrate an example of a memory circuit.
Figure 5B:
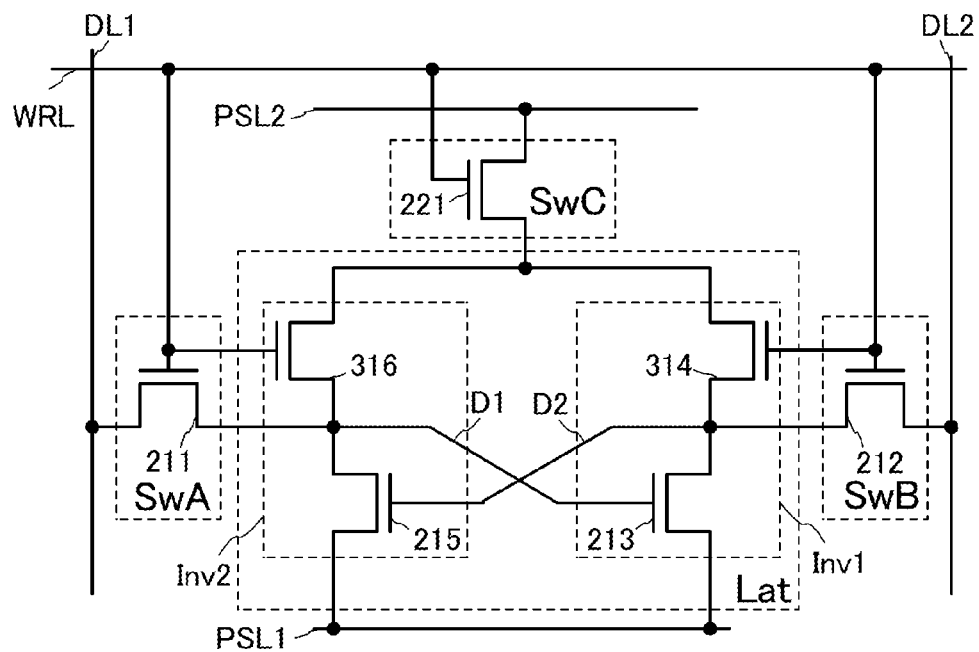

When transistors with low off-state current are used as the field-effect transistors 211 to 216 and the field-effect transistors 314 and 316, the memory circuit in this embodiment can have configurations illustrated in FIGS. 5A and 5B. The memory circuit illustrated in FIG. 5A includes the switch unit SwC in addition to the components illustrated in FIG. 4A, and the memory circuit illustrated in FIG. 5B includes the switch unit SwC in addition to the components illustrated in FIG. 4B.

The switch unit SwC has a field-effect transistor 221.

In the switch unit SwC illustrated in FIG. 5A, one of a source and a drain of the field-effect transistor 221 is electrically connected to the second power supply line PSL2. The other of the source and the drain of the field-effect transistor 221 is electrically connected to the one of the source and the drain of each of the field-effect transistors 214 and 216.

In the switch unit SwC illustrated in FIG. 5B, one of the source and the drain of the field-effect transistor 221 is electrically connected to the second power supply line PSL2. The other of the source and the drain of the field-effect transistor 221 is electrically connected to the one of the source and the drain of each of the field-effect transistors 314 and 316.

Figure 6A:
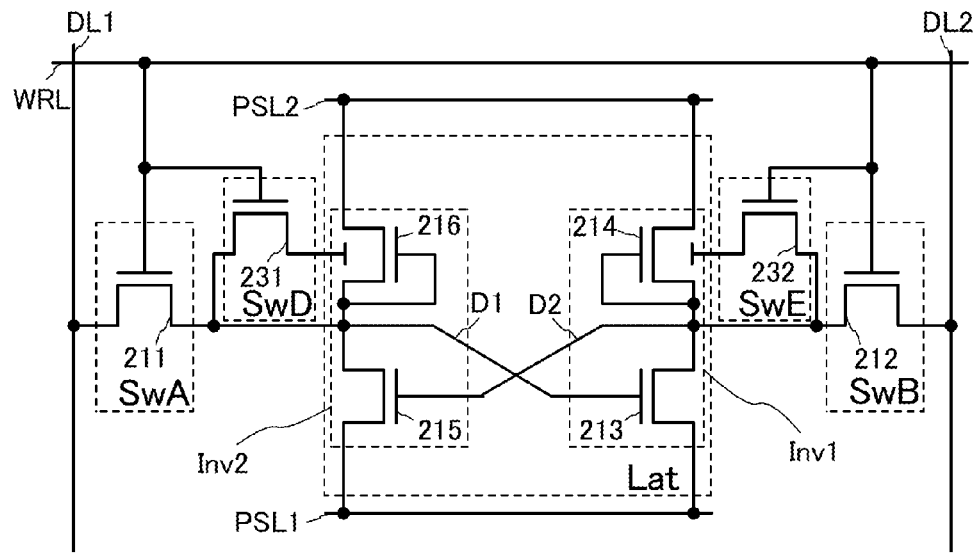
FIGS. 6A and 6B each illustrate an example of a memory circuit.
Figure 6B:
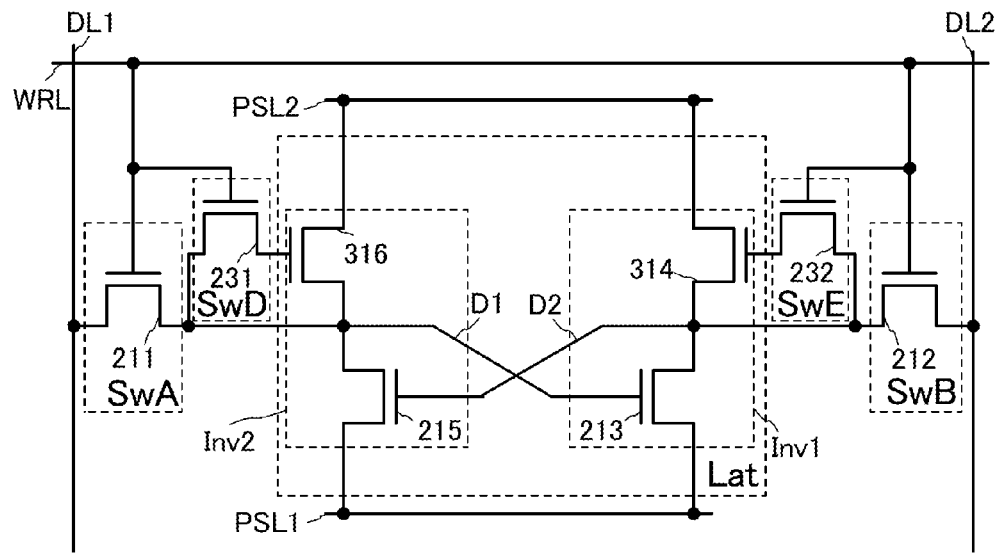

Alternatively, the memory circuit in this embodiment can have configurations illustrated in FIGS. 6A and 6B. The memory circuit illustrated in FIG. 6A includes a switch unit SwD and a switch unit SwE in addition to the components illustrated in FIG. 4A, and the memory circuit illustrated in FIG. 6B includes the switch unit SwD and the switch unit SwE in addition to the components illustrated in FIG. 4B.

The switch unit SwD has a field-effect transistor 231. One of a source and a drain of the field-effect transistor 231 is electrically connected to the gate of the field-effect transistor 213. The other of the source and the drain of the field-effect transistor 231 is electrically connected to the other of the pair of gates of the field-effect transistor 216. A gate of the field-effect transistor 231 is electrically connected to the rewrite/read control signal line WRL.

The switch unit SwE has a field-effect transistor 232. One of a source and a drain of the field-effect transistor 232 is electrically connected to the gate of the field-effect transistor 215. The other of the source and the drain of the field-effect transistor 232 is electrically connected to the other of the pair of gates of the field-effect transistor 214. A gate of the field-effect transistor 232 is electrically connected to the rewrite/read control signal line WRL.

Figure 7A:
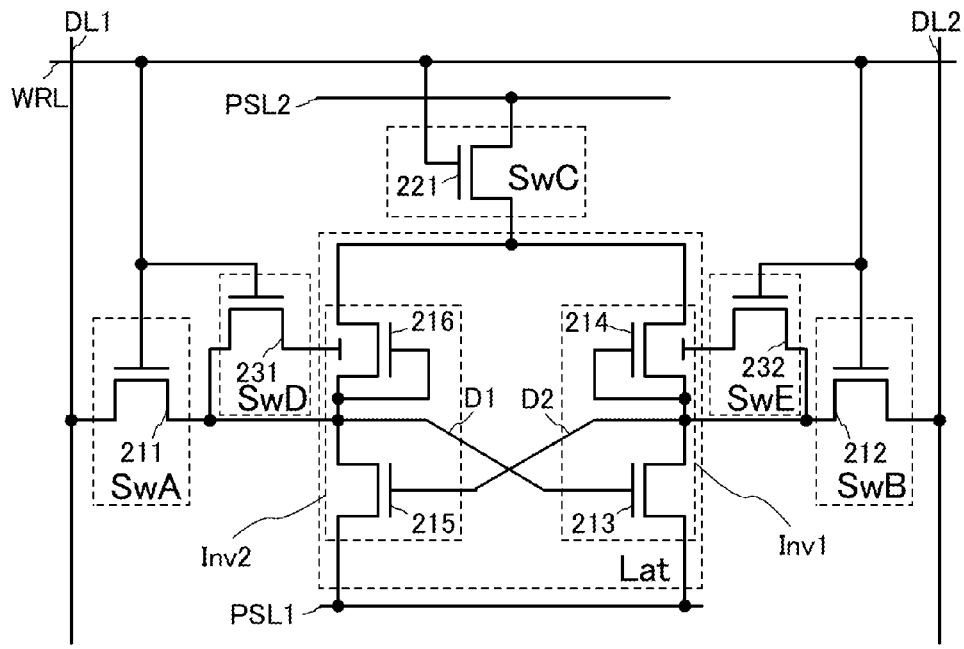
FIGS. 7A and 7B each illustrate an example of a memory circuit.
Figure 7B:
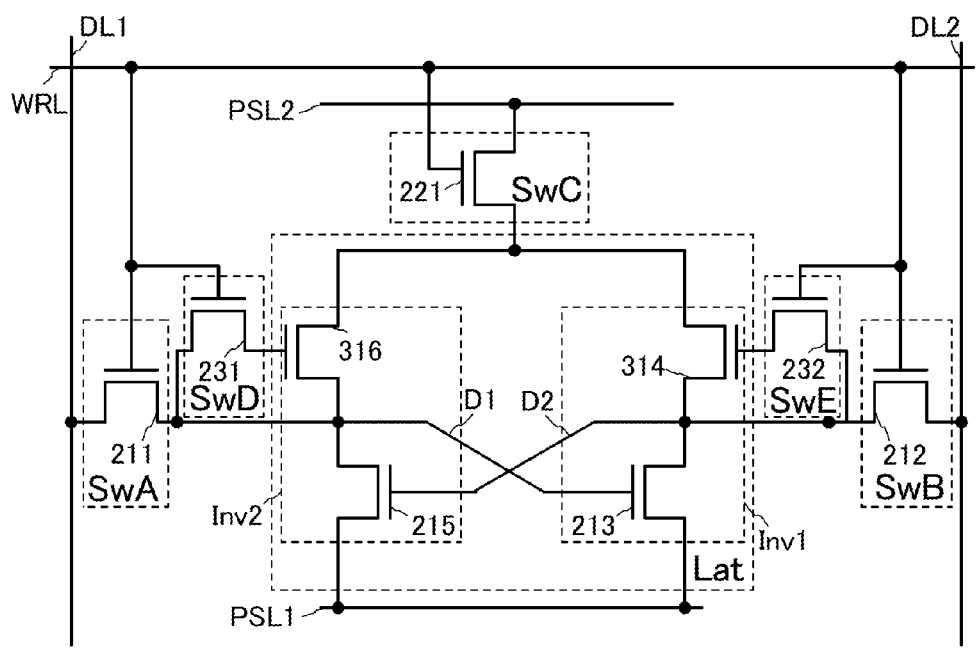

As illustrated in FIG. 7A, the switch units SwD and SwE can be additionally provided in the configuration in FIG. 5A, or as illustrated in FIG. 7B, the switch units SwD and SwE can be additionally provided in the configuration in FIG. 5B. The description of the switch units SwD and SwE illustrated in FIGS. 6A and 6B can apply to the switch units SwD and SwE here.

In the configuration where the switch units SwD and SwE are provided, when the field-effect transistors 231 and 232 are on in the rewrite period and the read period, the potential of the first data D1 is a high-level potential, and the potential of the second data D2 is a low-level potential, the field-effect transistor 214 can be turned off by setting the potential of the other of the pair of gates of the field-effect transistor 214 at a low-level potential and the field-effect transistor 216 can be turned on by setting the potential of the other of the pair of gates of the field-effect transistor 216 at a high-level potential.

Similarly, when the potential of the first data D1 is a low-level potential and the potential of the second data D2 is a high-level potential in the rewrite period and the read period, the field-effect transistor 214 can be turned on and the field-effect transistor 216 can be turned off.

When the potential of the first data D1 is a high-level potential and the potential of the second data D2 is a low-level potential in the rewrite period and the read period, the field-effect transistor 314 can be turned off and the field-effect transistor 316 can be turned on.

Further, when the potential of the first data D1 is a low-level potential and the potential of the second data D2 is a high-level potential in the rewrite period and the read period, the field-effect transistor 314 can be turned on and the field-effect transistor 316 can be turned off.

By thus providing the switch units SwD and SwE, the field-effect transistors that do not need to be on in the rewrite period and the read period can be turned off in these periods; accordingly, leakage current can be suppressed. Consequently, data stored in the rewrite period or data read in the read period can be prevented from varying due to leakage current generated in the first inverter Inv1 and the second inverter Inv2. Moreover, power consumption can be reduced.

The above is the description of the configuration examples of the memory circuit in this embodiment.

Figure 8:
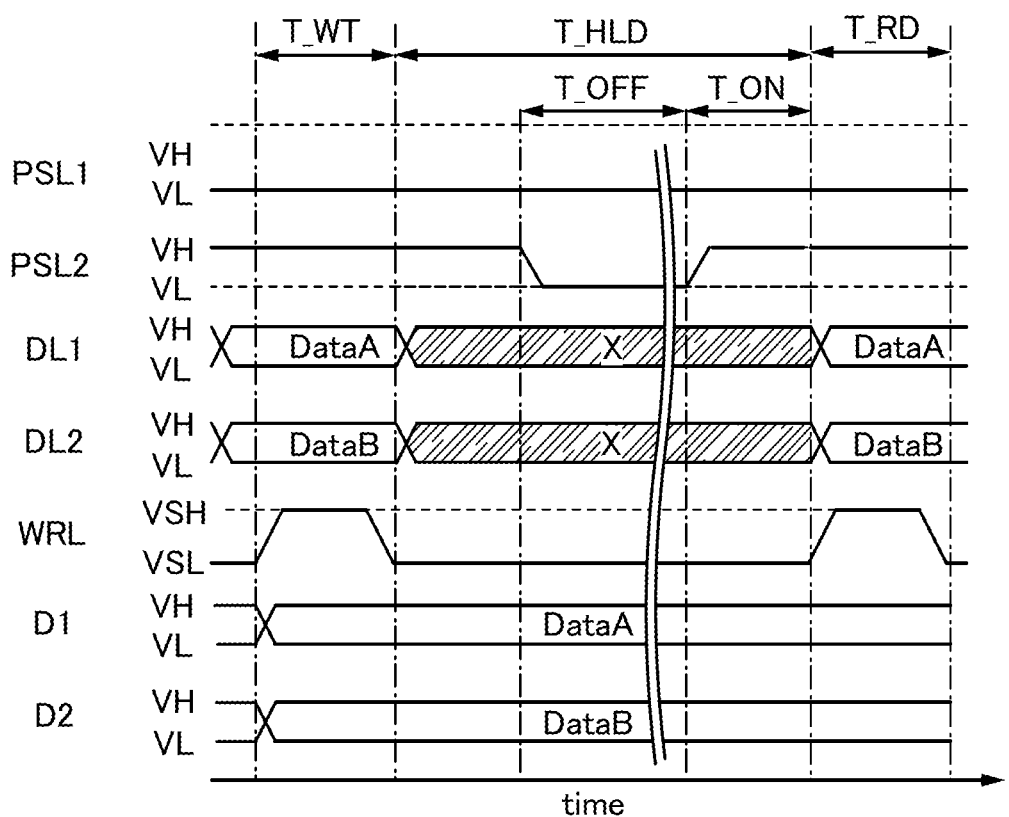
FIG. 8 is a timing chart for explaining an example of the memory circuit.

Next, as an example of a method for driving the memory circuit in this embodiment, an example of a method for driving the memory circuit illustrated in FIG. 4A will be described with reference to a timing chart in FIG. 8. Note that the memory circuit is a nonvolatile memory circuit, the potential of a high-level signal is the potential VH, the potential of a low-level signal is the potential VL, and an undefined (don't care) value is represented by X. A double wavy line in FIG. 8 represents omission.

In the example of a method for driving the memory circuit in this embodiment, first, the potentials of the first data signal line DL1 and the second data signal line DL2 are set in the rewrite period (the period T_WT). At this time, the potential of the first data signal line DL1 is set at DataA, and the potential of the second data signal line DL2 is set at DataB. One of DataA and DataB is a high-level potential and the other thereof is a low-level potential. The potential of the control signal WR is set at the potential VSH, whereby the potential of the rewrite/read control signal line WRL is set at the potential VSH.

In the rewrite period, the field-effect transistors 211 and 212 are turned on, and DataA is written as the first data D1 and DataB is written as the second data D2 of the latch unit Lat.

In the first inverter Inv1, the field-effect transistor 213 is turned on or off depending on the first data D1 (DataA). The field-effect transistor 214 is turned on in response to the control signal WR. Note that when the field-effect transistor 213 is on, the amount of current flowing between the source and the drain of the field-effect transistor 214 is smaller than the amount of current flowing to the other of the source and the drain of the field-effect transistor 213.

In the second inverter Inv2, the field-effect transistor 215 is turned on or off depending on the second data D2 (DataB). The field-effect transistor 216 is turned on in response to the control signal WR. Note that when the field-effect transistor 215 is on, the amount of current flowing between the source and the drain of the field-effect transistor 216 is smaller than the amount of current flowing to the other of the source and the drain of the field-effect transistor 215.

Then, in the hold period (the period T_HLD), the potential of the control signal WR is set at the potential VSL, and the potential of the rewrite/read control signal line WRL is set at the potential VSL.

At this time, the field-effect transistors 211 and 212 are turned off, and the first data D1 (DataA) and the second data D2 (DataB) written into the latch unit Lat are held by the first inverter Inv1 and the second inverter Inv2.

In the first inverter Inv1, the field-effect transistor 213 is turned on or off depending on the first data D1 (DataA). The field-effect transistor 214 is turned off in response to the control signal WR.

In the second inverter Inv2, the field-effect transistor 215 is turned on or off depending on the second data D2 (DataB). The field-effect transistor 216 is turned off in response to the control signal WR.

Then, in a power-off period (also referred to as period T_OFF) within the hold period, supply of the power supply voltage to the latch unit Lat through the first power supply line PSL1 and the second power supply line PSL2 stops.

At this time, the first data D1 (DataA) and the second data D2 (DataB) written into the latch unit Lat are held by the first inverter Inv1 and the second inverter Inv2.

After that, in a power-on period (also referred to as period T_ON), supply of the power supply voltage to the latch unit Lat through the first power supply line PSL1 and the second power supply line PSL2 starts again.

Then, in the read period (the period T_RD), the potential of the control signal WR is set at the potential VSH, and the potential of the rewrite/read control signal line WRL is set at the potential VSH.

At this time, the field-effect transistors 211 and 212 are turned on, and the potential of the first data signal line DL1 is set in response to DataA and the potential of the second data signal line DL2 is set in response to DataB. Thus, the first data D1 (DataA) and the second data D2 (DataB) stored in the latch unit Lat are read.

In the first inverter Inv1, the field-effect transistor 213 is turned on or off depending on the first data D1 (DataA). The field-effect transistor 214 is turned on in response to the control signal WR. Note that when the field-effect transistor 213 is on, the amount of current flowing between the source and the drain of the field-effect transistor 214 is smaller than the amount of current flowing to the other of the source and the drain of the field-effect transistor 213.

In the second inverter Inv2, the field-effect transistor 215 is turned on or off depending on the second data D2 (DataB). The field-effect transistor 216 is turned on in response to the control signal WR. Note that when the field-effect transistor 215 is on, the amount of current flowing between the source and the drain of the field-effect transistor 216 is smaller than the amount of current flowing to the other of the source and the drain of the field-effect transistor 215.

Accordingly, even if the value of the high-level data, which is one of the first data D1 and the second data D2 in the latch unit Lat, is changed during the hold period, for example, current flows between the source and the drain of the field-effect transistor 214 or the field-effect transistor 216 in the read period, whereby the value of the high-level data, which is one of the first data D1 and the second data D2, can be corrected.

The above is the description of the example of the memory circuit in this embodiment.

As has been described with FIGS. 4A and 4B, FIGS. 5A and 5B, FIGS. 6A and 6B, FIGS. 7A and 7B, and FIG. 8, in the memory circuit according to one example of this embodiment, the inverter composed of only transistors having the same conductivity type in the latch unit Lat is formed using a field-effect transistor, a gate potential of which is controlled in accordance with a control signal. Thus, the field-effect transistor can be off during a non-operating period such as the hold period. Consequently, generation of leakage current of the inverter can be suppressed, so that power consumption of the memory circuit can be reduced. Further, a control signal used for controlling the first switch unit and the second switch unit also controls the inverter, whereby the number of signals used in the memory circuit can be decreased.

In one example of this embodiment, the memory circuit is a nonvolatile memory circuit, in which case data can be held even if supply of the power supply voltage stops, for example. Accordingly, it is possible to stop supply of the power supply voltage to the memory circuit in the hold period, for example; thus, power consumption can be reduced while supply of the power supply voltage stops.

Embodiment 3

Figure 9A:
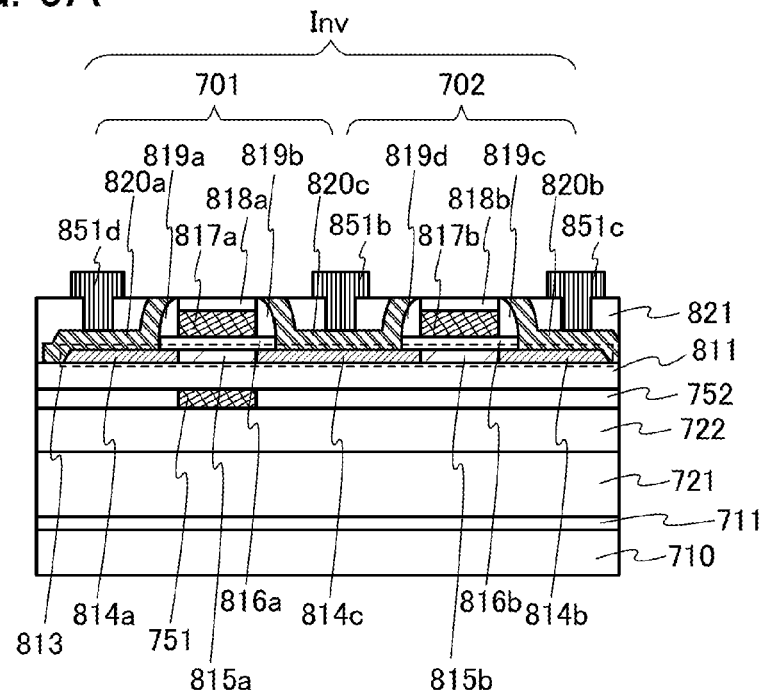
FIGS. 9A to 9C are schematic cross-sectional views illustrating an example of a structure of the memory circuit.
Figure 9B:
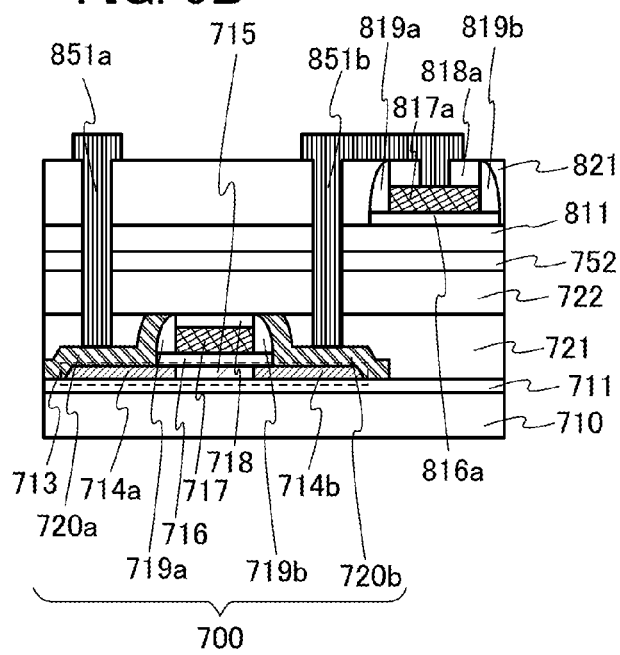
Figure 9C:
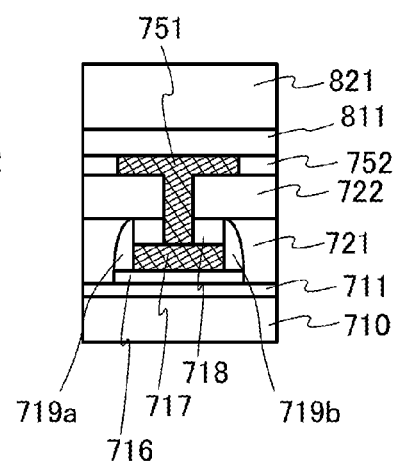

In this embodiment, an example of the structure of the memory circuit described in Embodiment 2 will be described with reference to FIGS. 9A to 9C. FIGS. 9A to 9C are schematic cross-sectional views.

As illustrated in FIGS. 9A to 9C, a memory circuit according to one example of this embodiment has a structure in which field-effect transistors 701 and 702 included in the first inverter Inv1 or the second inverter Inv2 are stacked over a field-effect transistor 700 provided in the switch unit SwA or the switch unit SwB. The field-effect transistors 700 to 702 have the same conductivity type. The field-effect transistor 701 has a pair of gates. Here, one of the pair of gates is called a first gate and the other thereof is called a second gate. Note that the structures of the field-effect transistors 700 to 702 are not limited to those illustrated in FIGS. 9A to 9C.

The memory circuit illustrated in FIGS. 9A to 9C includes an insulating layer 711, a semiconductor layer 713, an insulating layer 716, a conductive layer 717, an insulating layer 718, insulating layers 719a and 719b, conductive layers 720a and 720b, an insulating layer 721, an insulating layer 722, a conductive layer 751, an insulating layer 752, an insulating layer 811, a semiconductor layer 813, insulating layers 816a and 816b, conductive layers 817a and 817b, insulating layers 818a and 818b, insulating layers 819a to 819d, conductive layers 820a to 820c, an insulating layer 821, and conductive layers 851a to 851d.

The insulating layer 711 is provided over a substrate 710. The insulating layer 711 functions as a base layer.

The semiconductor layer 713 is provided over the insulating layer 711. The semiconductor layer 713 includes low-resistance regions 714a and 714b and a channel formation region 715 placed between the low-resistance regions 714a and 714b. The semiconductor layer 713 functions as a channel formation layer of the field-effect transistor 700.

The insulating layer 716 is provided over the semiconductor layer 713. The insulating layer 716 functions as a gate insulating layer of the field-effect transistor 700.

The conductive layer 717 overlaps the channel formation region 715 with the insulating layer 716 placed therebetween. The conductive layer 717 functions as a gate of the field-effect transistor 700. Note that the conductive layer 717 serving as the gate may be referred to as a gate electrode or a gate wiring.

The insulating layer 718 is provided over the conductive layer 717. The insulating layer 718 functions as a protective insulating layer of the field-effect transistor 700.

The insulating layer 719a is in contact with one of a pair of side surfaces of the conductive layer 717. The insulating layer 719b is in contact with the other of the pair of side surfaces of the conductive layer 717. The insulating layers 719a and 719b function as sidewalls.

The conductive layer 720a is in contact with the low-resistance region 714a and the insulating layer 719a. The conductive layer 720a functions as one of a source and a drain of the field-effect transistor 700.

The conductive layer 720b is in contact with the low-resistance region 714b and the insulating layer 719b. The conductive layer 720b functions as the other of the source and the drain of the field-effect transistor 700.

The insulating layer 721 is provided over the insulating layer 711 so as to fill recessed portions generated due to the field-effect transistor 700 and the like. The insulating layer 721 functions as a planarization layer.

The insulating layer 722 is provided over the field-effect transistor 700 and the insulating layer 721.

The conductive layer 751 is provided over part of the insulating layer 722. Moreover, as illustrated in FIG. 9C, the conductive layer 751 is in contact with the conductive layer 717 in a first opening that penetrates the insulating layer 718 and the insulating layer 722. The conductive layer 751 functions as the second gate of the field-effect transistor 701.

The insulating layer 752 is provided over the insulating layer 722 so as to fill recessed portions generated due to the conductive layer 751 and the like. The insulating layer 752 functions as a planarization layer.

The insulating layer 811 is provided over the conductive layer 751 and the insulating layer 752. The insulating layer 811 functions as a base layer. Note that the insulating layer 811 is thicker than the insulating layer 816a and the insulating layer 816b in FIGS. 9A and 9B; however, the structure is not limited thereto.

The semiconductor layer 813 is provided over the insulating layer 811. The semiconductor layer 813 includes low-resistance regions 814a to 814c, a channel formation region 815a placed between the low-resistance regions 814a and 814c, and a channel formation region 815b placed between the low-resistance regions 814b and 814c. The channel formation region 815a overlaps the conductive layer 751 with the insulating layer 811 placed therebetween. The semiconductor layer 813 functions as a channel formation layer of the field-effect transistors 701 and 702.

The insulating layer 816a is provided over part of the semiconductor layer 813 to overlap the channel formation region 815a. The insulating layer 816a functions as a gate insulating layer of the field-effect transistor 701.

The insulating layer 816b is provided over part of the semiconductor layer 813 to overlap the channel formation region 815b. The insulating layer 816b functions as a gate insulating layer of the field-effect transistor 702.

The conductive layer 817a overlaps the channel formation region 815a with the insulating layer 816a placed therebetween. The conductive layer 817a functions as the first gate of the field-effect transistor 701.

The conductive layer 817b overlaps the channel formation region 815b with the insulating layer 816b placed therebetween. The conductive layer 817b functions as a gate of the field-effect transistor 702.

The insulating layer 818a is provided over the conductive layer 817a. The insulating layer 818a functions as a protective insulating layer of the field-effect transistor 701.

The insulating layer 818b is provided over the conductive layer 817b. The insulating layer 818b functions as a protective insulating layer of the field-effect transistor 702.

The insulating layer 819a is in contact with one of a pair of side surfaces of the conductive layer 817a. The insulating layer 819b is in contact with the other of the pair of side surfaces of the conductive layer 817a. The insulating layer 819c is in contact with one of a pair of side surfaces of the conductive layer 817b. The insulating layer 819d is in contact with the other of the pair of side surfaces of the conductive layer 817b. The insulating layers 819a to 819d function as sidewalls.

The conductive layer 820a is in contact with the low-resistance region 814a and the insulating layer 819a. The conductive layer 820a functions as one of a source and a drain of the field-effect transistor 701.

The conductive layer 820b is in contact with the low-resistance region 814b and the insulating layer 819c. The conductive layer 820b functions as one of a source and a drain of the field-effect transistor 702.

The conductive layer 820c is in contact with the low-resistance region 814c and the insulating layers 819b and 819d. The conductive layer 820c functions as the other of the source and the drain of the field-effect transistor 701 and the other of the source and the drain of the field-effect transistor 702.

The insulating layer 821 is provided over the insulating layer 811 so as to fill recessed portions generated due to the field-effect transistors 701 and 702 and the like. The insulating layer 821 functions as a planarization layer.

The conductive layer 851a is in contact with the conductive layer 720a in a second opening that penetrates the insulating layer 721, the insulating layer 722, the insulating layer 752, the insulating layer 811, and the insulating layer 821. The conductive layer 851a functions as the data signal line DL.

The conductive layer 851b is in contact with the conductive layer 720b in a third opening that penetrates the insulating layer 721, the insulating layer 722, the insulating layer 752, the insulating layer 811, and the insulating layer 821. Moreover, the conductive layer 851b is in contact with the conductive layer 817a in a fourth opening that penetrates the insulating layer 818a, and is in contact with the conductive layer 820c in a fifth opening that penetrates the insulating layer 821. The conductive layer 851b functions as a connection wiring.

The conductive layer 851c is in contact with the conductive layer 820a in a sixth opening that penetrates the insulating layer 821. The conductive layer 851c functions as the first power supply line PSL1.

The conductive layer 851d is in contact with the conductive layer 820b in a seventh opening that penetrates the insulating layer 821. The conductive layer 851d functions as the second power supply line PSL2.

Next, the components will be described in detail below.

The substrate 710 can be a glass substrate or a silicon substrate, for example.

Each of the insulating layers 711 and 811 can be a layer containing a material such as silicon oxide, silicon nitride, silicon oxynitride, silicon nitride oxide, aluminum oxide, aluminum nitride, aluminum oxynitride, aluminum nitride oxide, or hafnium oxide, for example. Alternatively, each of the insulating layers 711 and 811 can be a stack of layers that can be used for the insulating layers 711 and 811.

Each of the semiconductor layers 713 and 813 can be a semiconductor layer of a material with a wider bandgap than silicon (e.g., an oxide semiconductor layer).

The oxide semiconductor layer is in a single crystal state, a polycrystalline (also referred to as polycrystal) state, an amorphous state, or the like.

Examples of an oxide semiconductor that can be used for the semiconductor layers 713 and 813 are a metal oxide containing zinc and at least one of indium and gallium, and the metal oxide in which gallium is partly or entirely replaced with another metal element.

As the metal oxide, an In-based metal oxide, a Zn-based metal oxide, an In—Zn-based metal oxide, or an In—Ga—Zn-based metal oxide can be used, for example. Alternatively, the In—Ga—Zn-based metal oxide in which Ga (gallium) is partly or entirely replaced with another metal element may be used.

As the aforementioned another metal element, a metal element that is capable of combining with more oxygen atoms than gallium can be used, for example, and specifically one or more of titanium, zirconium, hafnium, germanium, and tin can be used, for instance. Alternatively, as the aforementioned another metal element, one or more of lanthanum, cerium, praseodymium, neodymium, samarium, europium, gadolinium, terbium, dysprosium, holmium, erbium, thulium, ytterbium, and lutetium can be used. The aforementioned another metal element functions as a stabilizer. Note that the amount of the aforementioned another metal element added is determined so that the metal oxide can function as a semiconductor. When a metal element that is capable of combining with more oxygen atoms than gallium is used and oxygen is supplied to a metal oxide, oxygen defects in the metal oxide can be reduced.

For example, when tin is used instead of all of Ga (gallium) contained in the In—Ga—Zn-based metal oxide, an In—Sn—Zn-based metal oxide is obtained. When titanium is replaced with part of Ga (gallium) contained in the In—Ga—Zn-based metal oxide, an In—Ti—Ga—Zn-based metal oxide is obtained.

The oxide semiconductor layer may be an oxide semiconductor layer containing a c-axis aligned crystalline oxide semiconductor (CAAC-OS).

The CAAC-OS is an oxide semiconductor that is not completely single crystal nor completely amorphous and has a crystal-amorphous mixed phase structure including crystal parts in an amorphous phase. In each of the crystal parts included in the CAAC-OS, the c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and layers containing metal atoms and oxygen atoms are stacked. Note that a normal vector of the layer containing metal atoms and oxygen atoms is the c-axis direction. In this specification, the term "perpendicular" includes a range from 85° to 95°, and the term "parallel" includes a range from −5° to 5°.

In a field-effect transistor including an oxide semiconductor layer containing the CAAC-OS as a channel formation layer, variations in electrical characteristics due to irradiation with visible light and ultraviolet light are small; therefore, the reliability is high.

In the case where an oxide semiconductor layer is used as the semiconductor layers 713 and 813, the oxide semiconductor layer can be highly purified in the following manner, for example: dehydration or dehydrogenation is performed so that impurities such as hydrogen, water, a hydroxyl group, and a hydride (also referred to as hydrogen compound) are removed from the oxide semiconductor layer, and oxygen is supplied to the oxide semiconductor layer. For example, a layer containing oxygen is used as the layer in contact with the oxide semiconductor layer, and heat treatment is performed; thus, the oxide semiconductor layer can be highly purified.

For example, heat treatment is performed at a temperature higher than or equal to 150° C. and lower than the strain point of the substrate, preferably higher than or equal to 350° C. and lower than the strain point of the substrate, further preferably ranging from 350° C. to 450° C. Heat treatment may be further performed in a later step. As a heat treatment apparatus for the heat treatment, for example, an electric furnace or an apparatus for heating an object by heat conduction or heat radiation from a heater such as a resistance heater can be used; for instance, a rapid thermal annealing (RTA) apparatus such as a gas rapid thermal annealing (GRTA) apparatus or a lamp rapid thermal annealing (LRTA) apparatus can be used.

After the heat treatment, a high-purity oxygen gas, a high-purity $N_2O$ gas, or ultra-dry air (having a dew point of −40° C. or lower, preferably −60° C. or lower) may be introduced in the furnace where the heat treatment has been performed while the heating temperature is being maintained or being decreased. In this case, it is preferable that the oxygen gas or the $N_2O$ gas do not contain water, hydrogen, and the like. The purity of the oxygen gas or the $N_2O$ gas which is introduced into the heat treatment apparatus is preferably 6N or higher, more preferably 7N or higher (i.e., the impurity concentration of the oxygen gas or the $N_2O$ gas is preferably 1 ppm or lower, more preferably 0.1 ppm or lower). By the action of the oxygen gas or the $N_2O$ gas, oxygen is supplied to the oxide semiconductor layer, and defects due to oxygen vacancy in the oxide semiconductor layer can be reduced. Note that the high-purity oxygen gas, high-purity $N_2O$ gas, or ultra-dry air may be introduced at the time of the above heat treatment.

With the use of the highly purified oxide semiconductor, the carrier density of the oxide semiconductor layer in the field-effect transistor can be lower than $1\times10^{14}/cm^3$, preferably lower than $1\times10^{12}/cm^3$, further preferably lower than $1\times10^{11}/cm^3$. The off-state current of the field-effect transistor per micrometer of channel width can be 10 aA ($1\times10^{-17}$ A) or less, preferably 1 aA ($1\times10^{-18}$ A) or less, more preferably 10 zA ($1\times10^{-20}$ A) or less, further preferably 1 zA ($1\times10^{-21}$ A) or less, still more preferably 100 yA ($1\times10^{-22}$ A) or less. It is preferable that the off-state current of the field-effect transistor be as low as possible; the lower limit of the off-state current of the field-effect transistor is estimated to be approximately $10^{-30}$ A/μm.

The low-resistance regions 714a, 714b, 814a, 814b, and 814c contain dopants. As the dopant, one or more of elements of Group 13 in the periodic table (e.g., boron), elements of Group 15 in the periodic table (e.g., one or more of nitrogen, phosphorus, and arsenic), and rare gas elements (e.g., one or more of helium, argon, and xenon) can be used, for example.

Each of the insulating layers 716, 816a, and 816b can be a layer containing a material such as silicon oxide, silicon nitride, silicon oxynitride, silicon nitride oxide, aluminum oxide, aluminum nitride, aluminum oxynitride, aluminum nitride oxide, or hafnium oxide, for example. Alternatively, each of the insulating layers 716, 816a, and 816b can be a stack of layers that can be used for the insulating layers 716, 816a, and 816b.

Each of the conductive layers 717, 817a, and 817b can be a layer containing a metal material such as molybdenum, titanium, chromium, tantalum, magnesium, silver, tungsten, aluminum, copper, neodymium, or scandium, for example. Alternatively, each of the conductive layers 717, 817a, and 817b can be a stack of layers that can be used for the conductive layers 717, 817a, and 817b.

Each of the insulating layers 718, 818a, and 818b can be a layer containing a material such as silicon oxide, silicon nitride, silicon oxynitride, silicon nitride oxide, aluminum oxide, aluminum nitride, aluminum oxynitride, aluminum nitride oxide, or hafnium oxide, for example. Alternatively, each of the insulating layers 718, 818a, and 818b can be a stack of layers that can be used for the insulating layers 718, 818a, and 818b.

Each of the insulating layers 719a and 719b and the insulating layers 819a to 819d can be a layer containing a material such as silicon oxide, silicon nitride, silicon oxynitride, silicon nitride oxide, aluminum oxide, aluminum nitride, aluminum oxynitride, aluminum nitride oxide, or hafnium oxide, for example. Alternatively, each of the insulating layers 719a and 719b and the insulating layers 819a to 819d can be a stack of layers that can be used for the insulating layers 719a and 719b and the insulating layers 819a to 819d.

Each of the conductive layers 720a and 720b and the conductive layers 820a to 820c can be a layer containing a metal material such as molybdenum, titanium, chromium, tantalum, magnesium, silver, tungsten, aluminum, copper, neodymium, scandium, or ruthenium, for example. Alternatively, each of the conductive layers 720a and 720b and the conductive layers 820a to 820c can be a stack of layers that can be used for the conductive layers 720a and 720b and the conductive layers 820a to 820c.

Each of the insulating layers 721, 722, and 821 can be a layer containing a material such as silicon oxide, silicon nitride, silicon oxynitride, silicon nitride oxide, aluminum oxide, aluminum nitride, aluminum oxynitride, aluminum nitride oxide, or hafnium oxide, for example. Alternatively, each of the insulating layers 721, 722, and 821 can be a stack of layers that can be used for the insulating layers 721, 722, and 821.

The conductive layer 751 can be a layer containing a metal material such as molybdenum, titanium, chromium, tantalum, magnesium, silver, tungsten, aluminum, copper, neodymium, scandium, or ruthenium, for example. Alternatively, the conductive layer 751 can be a stack of layers that can be used for the conductive layer 751.

The insulating layer 752 can be a layer containing a material such as silicon oxide, silicon nitride, silicon oxynitride, silicon nitride oxide, aluminum oxide, aluminum nitride, aluminum oxynitride, aluminum nitride oxide, or hafnium oxide, for example. Alternatively, the insulating layer 752 can be a stack of layers that can be used for the insulating layer 752.

Each of the conductive layers 851a to 851d can be a layer containing a metal material such as molybdenum, titanium, chromium, tantalum, magnesium, silver, tungsten, aluminum, copper, neodymium, scandium, or ruthenium, for example. Alternatively, each of the conductive layers 851a to 851d can be a stack of layers that can be used for the conductive layers 851a to 851d.

The above is the description of the structure example of the memory device illustrated in FIGS. 9A to 9C.

As described with reference to FIGS. 9A to 9C, the memory circuit according to one example of this embodiment is composed by stacking a plurality of field-effect transistors, resulting in reduction in the circuit area.

Embodiment 4

In this embodiment, as a memory device including the above-described memory circuit, an example of static random access memory (SRAM) will be described with reference to FIG. 10.

Figure 10:
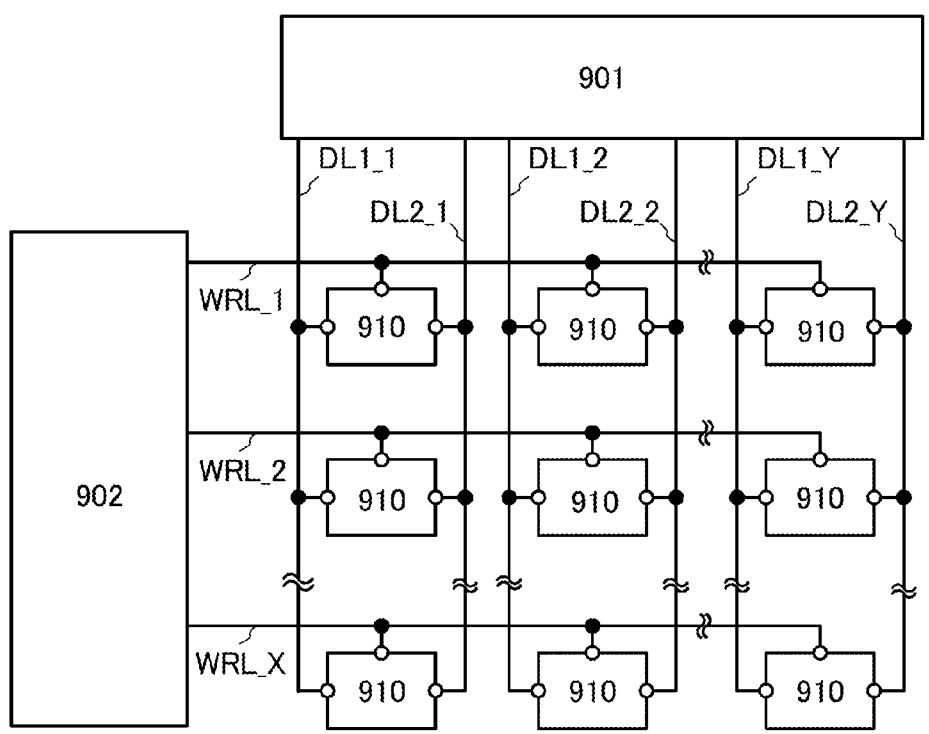
FIG. 10 is a block diagram illustrating an example of a memory device.

A memory device illustrated in FIG. 10 includes a driver circuit 901, a driver circuit 902, and a plurality of memory cells 910 arranged in X rows and Y columns (each of X and Y is a natural number of 2 or more).

The driver circuit 901 is supplied with a data signal and a column address signal. The driver circuit 901 selects a column address of a memory cell 910 that is a target for data rewriting or reading by controlling the potentials of first data signal lines DL1_1 to DL1_Y and second data signal lines DL2_1 to DL2_Y. The driver circuit 901 includes a column decoder and a sense amplifier.

The driver circuit 902 is supplied with a row address signal. The driver circuit 902 selects one of rewrite/read control signal lines WRL_1 to WRL_X in response to an inputted row address signal, and selects a row address of the memory cell 910 that is the target for data rewriting or reading by controlling the potential of the selected rewrite/read control signal line WRL. The driver circuit 902 includes a row decoder.

As the memory cell 910, any of the memory circuits described in Embodiments 1 and 2 can be used, for example. In this case, the first data signal line DL1 electrically connected to the memory cell 910 in the M-th row (M is a natural number of X or less) and the N-th column (N is a natural number of Y or less) is the first data signal line DL1_N. Moreover, the second data signal line DL2 electrically connected to the memory cell 910 in the M-th row and the N-th column is the second data signal line DL2_N. The rewrite/read control signal line WRL electrically connected to the memory cell 910 in the M-th row and the N-th column is the rewrite/read control signal line WRL_M. The memory cell 910 is selected by the driver circuit 901 and the driver circuit 902, and the selected memory cell 910 is subjected to data rewriting or reading.

The above is the description of the example of the memory device in this embodiment.

According to one example of this embodiment, a low-power memory device can be provided by using the memory circuit in any of the above embodiments as a memory cell of SRAM as has been described with FIG. 10.

In addition, according to one example of this embodiment, a nonvolatile memory device can be provided by using the nonvolatile memory circuit in any of the above embodiments as a memory cell of SRAM.

Embodiment 5

In this embodiment, an example of an arithmetic processing unit, such as a CPU, including the memory device shown in Embodiment 4 as a memory will be described.

An example of the arithmetic processing unit in this embodiment is described with reference to FIG. 11.

Figure 11:
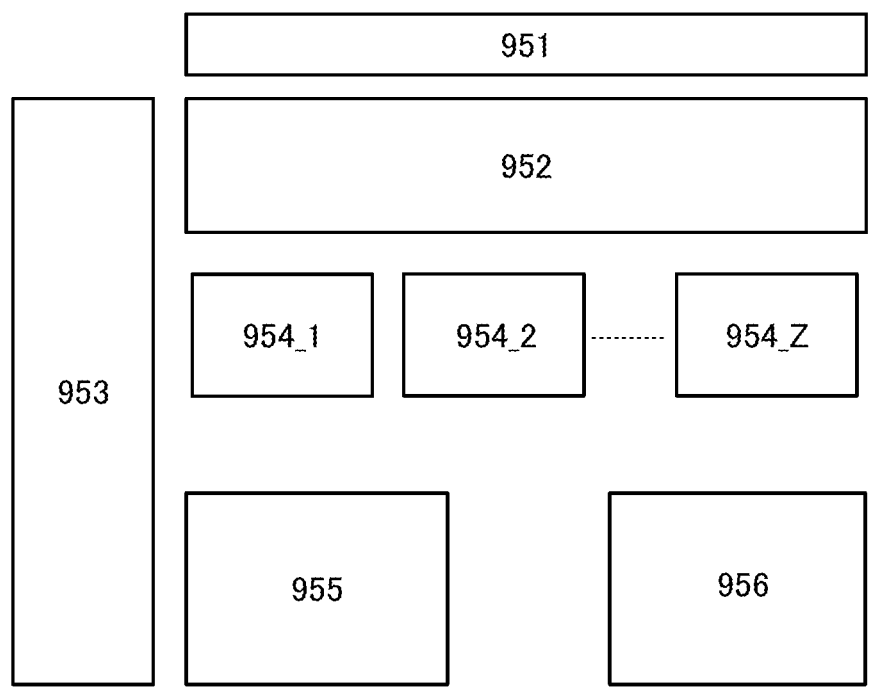
FIG. 11 is a block diagram illustrating an example of an arithmetic processing unit.

The arithmetic processing unit illustrated in FIG. 11 includes a bus interface 951, a control circuit 952, a cache memory 953, first to Z-th registers 954 (Z is a natural number of 3 or more), an instruction decoder 955, and an arithmetic logic unit 956.

The bus interface 951 has a function of exchanging signals with the outside of the arithmetic processing unit and a function of exchanging signals with the circuits in the arithmetic processing unit, for example.

The control circuit 952 has a function of controlling operations of the circuits in the arithmetic processing unit.

The control circuit 952 can include an integrated circuit, for example.

The cache memory 953 is controlled by the control circuit 952 and has a function of temporarily retaining data used while the arithmetic processing unit operates. Note that the arithmetic processing unit may include a plurality of cache memories 953 as a primary cache and a secondary cache, for example.

As the cache memory 953, the memory device shown in Embodiment 4 can be used, for example.

The first to Z-th registers 954 are controlled by the control circuit 952 and have a function of storing data used for arithmetic processing. For example, one register 954 may be used as a register for the arithmetic logic unit 956 and another register 954 may be used as a register for the instruction decoder 955.

The instruction decoder 955 has a function of translating a read instruction signal. The translated instruction signal is input to the control circuit 952, and the control circuit 952 outputs a control signal corresponding to the instruction signal to the arithmetic logic unit 956.

The arithmetic logic unit 956 is controlled by the control circuit 952 and has a function of performing logical operation in response to the inputted instruction signal.

According to one example of this embodiment, a low-power arithmetic processing unit can be provided by using the memory device in Embodiment 4 as a cache memory as has been described with FIG. 11.

In the arithmetic processing unit according to one example of this embodiment, by using the nonvolatile memory device in Embodiment 4 as the cache memory, part of internal data existing just before supply of the power supply voltage stops can be retained in the cache memory even when supply of the power supply voltage stops, and when supply of the power supply voltage restarts, the state of the arithmetic processing unit can be returned to the one immediately before stop of supply of the power supply voltage. Accordingly, even if supply of the power supply voltage stops temporarily, the time after supply of the power supply voltage restarts until the normal operation starts can be shortened.

Embodiment 6

In this embodiment, examples of electronic devices including the arithmetic processing unit in Embodiment 5 in a calculation unit will be described with reference to FIGS. 12A to 12D and FIG. 13.

FIGS. 12A to 12D each illustrate the appearance of an electronic device in this embodiment.

Figure 12A:
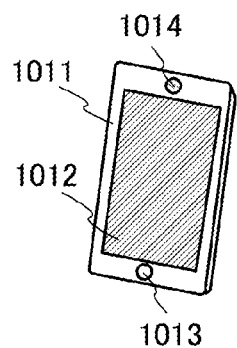
FIGS. 12A to 12D each illustrate an example of an electronic device.

The electronic device illustrated in FIG. 12A is an example of a personal digital assistant.

The electronic device illustrated in FIG. 12A includes a housing 1011, a panel 1012 incorporated in the housing 1011, a button 1013, and a speaker 1014.

The housing 1011 may be provided with a connection terminal for connecting the electronic device in FIG. 12A to an external device and/or a button used to operate the electronic device in FIG. 12A.

The panel 1012 functions as a display panel and a touch panel.

The button 1013 is provided on the housing 1011. For example, when the button 1013 serving as a power button is provided, the electronic device can be turned on or off by pressing the button 1013.

The speaker 1014 is provided on the housing 1011. The speaker 1014 has a function of outputting sound.

The housing 1011 may be provided with a microphone, in which case the electronic device in FIG. 12A can function as a telephone, for example.

The electronic device illustrated in FIG. 12A has a function of at least one of a telephone, an e-book reader, a personal computer, and a game machine, for example.

Figure 12B:
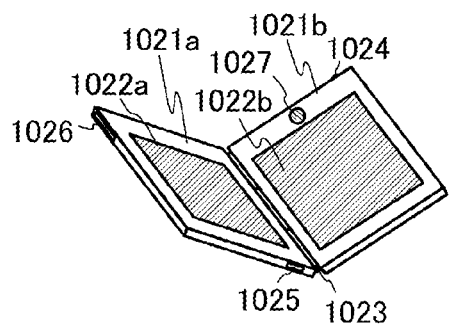

The electronic device illustrated in FIG. 12B is an example of a foldable personal digital assistant.

The electronic device illustrated in FIG. 12B includes a housing 1021a, a housing 1021b, a panel 1022a incorporated in the housing 1021a, a panel 1022b incorporated in the housing 1021b, a hinge 1023, a button 1024, a connection terminal 1025, a storage medium insertion portion 1026, and a speaker 1027.

The housing 1021a and the housing 1021b are connected with the hinge 1023.

Each of the panels 1022a and 1022b functions as a display panel and a touch panel.

In the electronic device illustrated in FIG. 12B, the housing 1021a can be made to overlap the housing 1021b, for example, by moving the housing 1021a or the housing 1021b with the use of the hinge 1023, so that the electronic device can be folded.

The button 1024 is provided on the housing 1021b. Note that the button 1024 may be provided on the housing 1021a. When the button 1024 having a function of a power button is provided, whether to supply power to a circuit in the electronic device can be controlled by pressing the button 1024.

The connection terminal 1025 is provided on the housing 1021a. Note that the connection terminal 1025 may be provided on the housing 1021b. Alternatively, a plurality of connection terminals 1025 may be provided on one or both of the housings 1021a and 1021b. The connection terminal 1025 is a terminal for connecting the electronic device in FIG. 12B to another device.

The storage medium insertion portion 1026 is provided on the housing 1021a. Note that the storage medium insertion portion 1026 may be provided on the housing 1021b. Alternatively, a plurality of storage medium insertion portions 1026 may be provided on one or both of the housings 1021a and 1021b. For example, when a card storage medium is inserted into the storage medium insertion portion 1026, data can be read from the card storage medium and sent to the electronic device, or data stored in the electronic device can be written into the card storage medium.

The speaker 1027 is provided on the housing 1021b. The speaker 1027 has a function of outputting sound. Note that the speaker 1027 may be provided on the housing 1021a instead of on the housing 1021b.

The housing 1021a or the housing 1021b may be provided with a microphone, in which case the electronic device in FIG. 12B can function as a telephone, for example.

The electronic device illustrated in FIG. 12B has a function of at least one of a telephone, an e-book reader, a personal computer, and a game machine, for example.

Figure 12C:
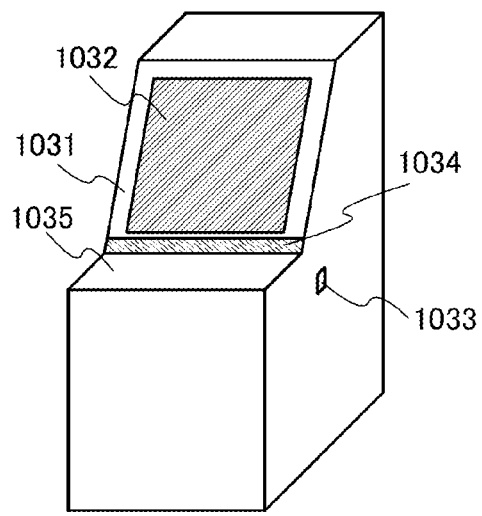

The electronic device illustrated in FIG. 12C is an example of a stationary information terminal. The stationary information terminal illustrated in FIG. 12C includes a housing 1031, a panel 1032 incorporated in the housing 1031, a button 1033, and a speaker 1034.

The panel 1032 functions as a display panel and a touch panel.

Note that the panel 1032 may be provided on a top board 1035 of the housing 1031.

Further, the housing 1031 may be provided with at least one of a ticket slot for issuing a ticket or the like, a coin slot, and a bill slot.

The button 1033 is provided on the housing 1031. When the button 1033 having a function of a power button is provided, whether to supply power to a circuit in the electronic device can be controlled by pressing the button 1033.

The speaker 1034 is provided on the housing 1031. The speaker 1034 has a function of outputting sound.

The electronic device illustrated in FIG. 12C serves as an automated teller machine, an information communication terminal (also referred to as multimedia station) for ordering a ticket or the like, or a game machine, for example.

Figure 12D:
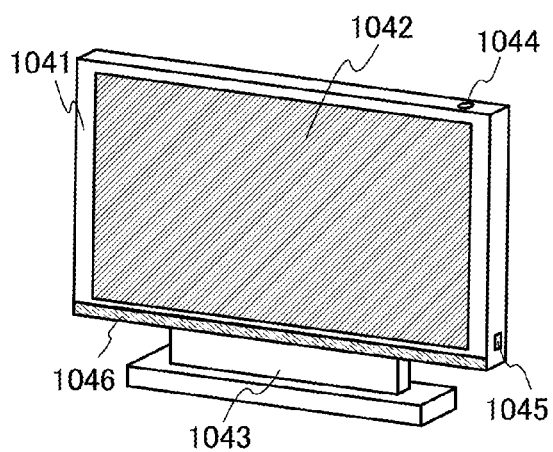

FIG. 12D illustrates an example of a stationary information terminal. The electronic device illustrated in FIG. 12D includes a housing 1041, a panel 1042 incorporated in the housing 1041, a support 1043 for supporting the housing 1041, a button 1044, a connection terminal 1045, and a speaker 1046.

Note that the housing 1041 may be provided with a connection terminal for connecting the electronic device in FIG. 12D to an external device and/or a button for operating the electronic device in FIG. 12D.

The panel 1042 functions as a display panel. The panel 1042 may also function as a touch panel.

The button 1044 is provided on the housing 1041. When the button 1044 having a function of a power button is provided, whether to supply power to a circuit in the electronic device can be controlled by pressing the button 1044.

The connection terminal 1045 is provided on the housing 1041. The connection terminal 1045 is a terminal for connecting the electronic device in FIG. 12D to another device. For example, when the electronic device in FIG. 12D and a personal computer are connected with the connection terminal 1045, the panel 1042 can display an image corresponding to a data signal input from the personal computer. For example, when the panel 1042 of the electronic device in FIG. 12D is larger than a panel of another electronic device connected thereto, a displayed image of the other electronic device can be enlarged, so that a plurality of viewers can easily see the image at the same time.

The speaker 1046 is provided on the housing 1041. The speaker 1046 has a function of outputting sound.

The electronic device illustrated in FIG. 12D functions as an output monitor, a personal computer, or a television set, for example.

Figure 13:
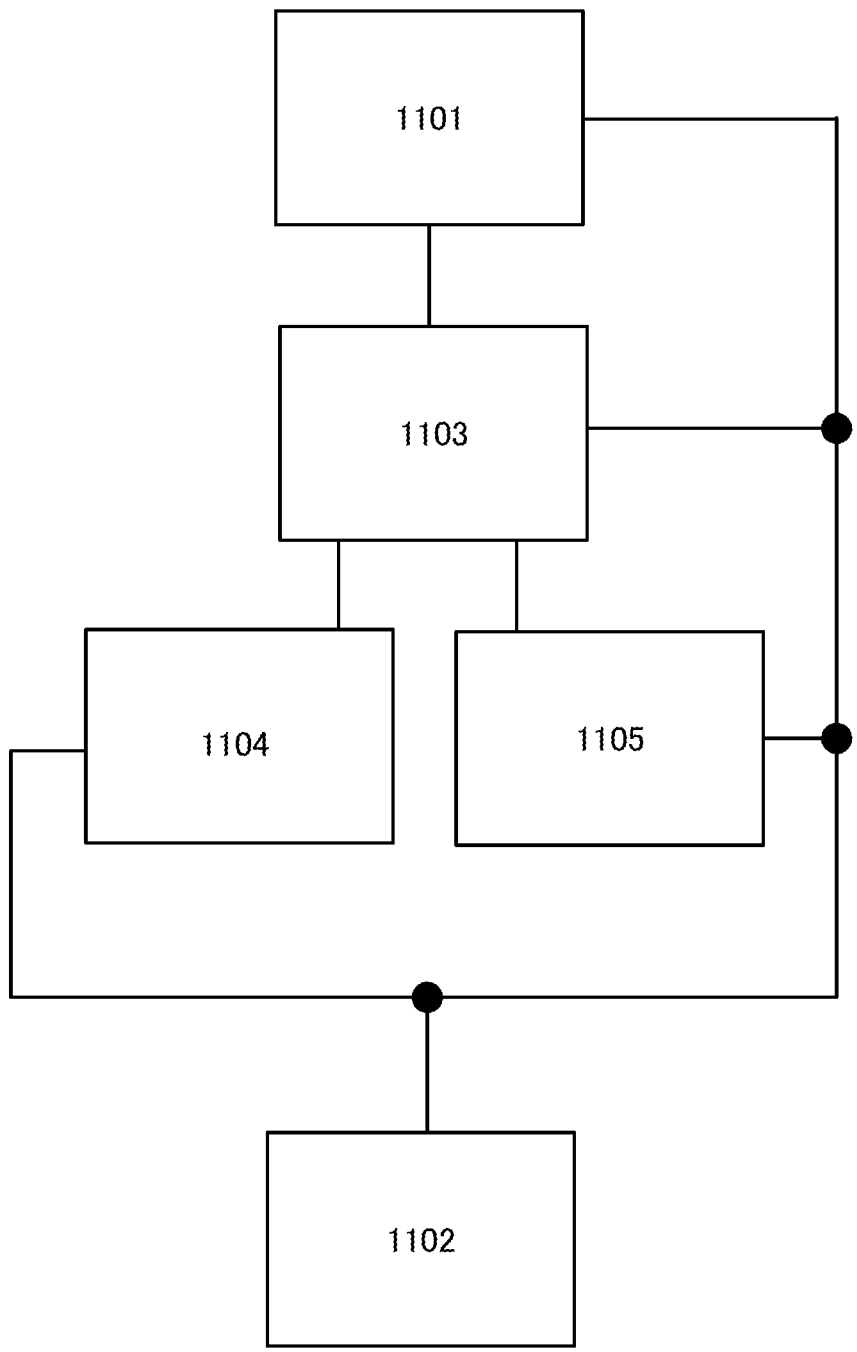
FIG. 13 illustrates an example of an electronic device.

FIG. 13 illustrates an example of circuit blocks in the electronic devices illustrated in FIGS. 12A to 12D.

The electronic device illustrated in FIG. 13 includes a communication unit 1101, a power source unit 1102, a calculation unit 1103, an audio unit 1104, and a panel unit 1105.

The communication unit 1101 has a function of transmitting and receiving data. For example, in order to perform wireless communication, the communication unit 1101 is provided with an antenna, a demodulator circuit, a modulator circuit, and the like. In this case, the communication unit 1101 exchanges data with the outside by transmitting and receiving radio waves with the antenna. Note that a plurality of antennas may be provided in the communication unit 1101. The communication unit 1101 may transmit and receive data through wired communication.

The power source unit 1102 has a function of supplying power for operating the electronic device. For example, power is supplied from the power source unit 1102 to the communication unit 1101, the calculation unit 1103, the audio unit 1104, and the panel unit 1105. Note that a power storage device may be provided in the power source unit 1102, in which case the power storage device is provided inside the housing of the electronic device. A power source circuit that generates the power supply voltage for operating the electronic device may be provided in the power source unit 1102. When the power storage device is provided in the power source unit 1102, the power supply voltage is generated in the power source circuit by using power supplied from the power storage device. In the case where the power storage device is provided, the electronic device can be driven by using the power storage device as a power source even if there is no supply of power from the commercial power supply because of a power failure or the like, for example.

The calculation unit 1103 has a function of performing arithmetic processing in response to instruction signals based on data of data signals input from the communication unit 1101, the audio unit 1104, and the panel unit 1105, for example. The calculation unit 1103 is provided inside the housing of the electronic device, for example.

The arithmetic processing unit described in Embodiment 5 is provided in the calculation unit 1103.

The audio unit 1104 has a function of controlling input and output of sound that is audio data. For example, the audio unit 1104 controls output of sound from a speaker. When the electronic device includes a microphone, the audio unit 1104 has a function of controlling input of sound from the microphone.

The panel unit 1105 has a function of controlling the operation of the panel in the electronic device. For example, the panel unit 1105 may be provided with a driver circuit for controlling drive of the panel so that the operation of the panel is controlled.

Note that a control circuit may be provided in at least one of the communication unit 1101, the power source unit 1102, the calculation unit 1103, the audio unit 1104, and the panel unit 1105 to control the operation of each circuit block. Further, a control circuit may be provided in the calculation unit 1103 to control the operation of one or more of the communication unit 1101, the power source unit 1102, the audio unit 1104, and the panel unit 1105.

A memory circuit may be provided in one or more of the communication unit 1101, the power source unit 1102, the audio unit 1104, and the panel unit 1105 so as to store data necessary for the operation of each unit. Thus, the operation speed can be increased.

This application is based on Japanese Patent Applications serial No. 2011-256890 filed with Japan Patent Office on Nov. 25, 2011, the entire contents of which are hereby incorporated by reference.

What is claimed is:

1. A memory circuit comprising:
   a latch unit configured to store first data and second data, the first data and the second data being rewritten into and read from the latch unit in accordance with a control signal;
   a first switch unit configured to control rewrite and read of the first data stored in the latch unit, by being turned on or off in response to the control signal; and
   a second switch unit configured to control rewrite and read of the second data stored in the latch unit, by being turned on or off in response to the control signal,
   wherein the latch unit comprises:
      a first inverter having an input terminal whose potential is the first data, the first inverter being configured to maintain a value of the second data in response to a potential of an output terminal of the first inverter; and
      a second inverter having an input terminal whose potential is the second data, the second inverter being configured to maintain a value of the first data in response to a potential of an output terminal of the second inverter, and
   wherein at least one of the first inverter and the second inverter comprises:
      a first field-effect transistor having a gate serving as the input terminal of the one of the first inverter and the second inverter, the first field-effect transistor being configured to control whether the potential of the output terminal of the one of the first inverter and the second inverter is set at a first potential or not in accordance with the potential of the input terminal of the one of the first inverter and the second inverter; and
      a second field-effect transistor having a same conductivity type as the first field-effect transistor, the second field-effect transistor having a gate potential controlled in accordance with the control signal, the second field-effect transistor being configured to control whether the potential of the output terminal of the one of the first inverter and the second inverter is set at a second potential or not in accordance with the control signal.

2. The memory circuit according to claim 1,
   wherein all of field-effect transistors included in the latch unit, the first switch unit, and the second switch unit have an off-state current of 1 zA or less per channel width of 1 µm.

3. The memory circuit according to claim 1, further comprising:
   a third switch unit configured to control whether a power supply voltage is supplied to the latch unit, by being turned on or off in response to the control signal.

4. The memory circuit according to claim 3,
   wherein the third switch unit comprises a third field-effect transistor, and
   wherein the third field-effect transistor has an off-state current of 1 zA or less per channel width of 1 µm.

5. The memory circuit according to claim 4,
   wherein the first switch unit comprises a fourth field-effect transistor, and
   wherein the second switch unit comprises a fifth field-effect transistor.

6. The memory circuit according to claim 5,
   wherein each of the first field-effect transistor, the second field-effect transistor, the third field-effect transistor, the fourth field-effect transistor, and the fifth field-effect transistor includes an oxide semiconductor layer.

7. A memory device comprising:
   memory cells of X rows and Y columns, where each of X and Y is a natural number of 2 or more, each of the memory cells having the memory circuit according to claim 1;
   a first driver circuit configured to select a column address of a memory cell targeted for data rewriting or reading; and
   a second driver circuit configured to select a row address of the memory cell targeted for data rewriting or reading.

8. A memory circuit comprising:
   a latch unit supplied with a control signal;
   a first switch unit supplied with the control signal between a first signal line and the latch unit; and
   a second switch unit supplied with the control signal between a second signal line and the latch unit,
   wherein the latch unit comprises a first inverter and a second inverter, an input terminal of the first inverter is electrically connected to an output terminal of the second inverter, and an input terminal of the second inverter is electrically connected to an output terminal of the first inverter,
   wherein each of the first inverter and the second inverter comprises:
      a first field-effect transistor having a first terminal, a second terminal, and a first gate serving as the input terminal, and
      a second field-effect transistor having a same conductivity type as the first field-effect transistor, and having a third terminal, a fourth terminal, a second gate electrically connected to the third terminal and the output terminal, and a third gate supplied with the control signal.

9. The memory circuit according to claim 8,
   wherein all of field-effect transistors included in the latch unit, the first switch unit, and the second switch unit have an off-state current of 1 zA or less per channel width of 1 µm.

10. The memory circuit according to claim 8, further comprising:
    a third switch unit supplied with the control signal is provided between the latch unit and a power supply line.

11. The memory circuit according to claim 10,
    wherein the third switch unit comprises a third field-effect transistor, and
    wherein the third field-effect transistor has an off-state current of 1 zA or less per channel width of 1 µm.

12. The memory circuit according to claim 11,
    wherein the first switch unit comprises a fourth field-effect transistor, and
    wherein the second switch unit comprises a fifth field-effect transistor.

13. The memory circuit according to claim 12,
    wherein each of the first field-effect transistor, the second field-effect transistor, the third field-effect transistor, the fourth field-effect transistor, and the fifth field-effect transistor includes an oxide semiconductor layer.

14. A memory device comprising:
memory cells of X rows and Y columns, where each of X and Y is a natural number of 2 or more, each of the memory cells having the memory circuit according to claim 8;
a first driver circuit configured to select a column address of a memory cell targeted for data rewriting or reading; and
a second driver circuit configured to select a row address of the memory cell targeted for data rewriting or reading.

15. A memory circuit comprising:
a latch unit supplied with a control signal;
a first switch unit supplied with the control signal between a first signal line and the latch unit; and
a second switch unit supplied with the control signal between a second signal line and the latch unit,
wherein the latch unit comprises a first inverter and a second inverter, an input terminal of the first inverter is electrically connected to an output terminal of the second inverter, and an input terminal of the second inverter is electrically connected to an output terminal of the first inverter,
wherein each of the first inverter and the second inverter comprises:
 a first field-effect transistor having a first terminal serving as the output terminal, a second terminal, and a first gate serving as the input terminal, and
 a second field-effect transistor having a same conductivity type as the first field-effect transistor, and having a third terminal, a fourth terminal electrically connected to the first terminal, a second gate.

16. The memory circuit according to claim 15, wherein all of field-effect transistors included in the latch unit, the first switch unit, and the second switch unit have an off-state current of 1 zA or less per channel width of 1 μm.

17. The memory circuit according to claim 15, further comprising:
a third switch unit supplied with the control signal is provided between the latch unit and a power supply line.

18. The memory circuit according to claim 17,
wherein the third switch unit comprises a third field-effect transistor, and
wherein the third field-effect transistor has an off-state current of 1 zA or less per channel width of 1 μm.

19. The memory circuit according to claim 18,
wherein the first switch unit comprises a fourth field-effect transistor, and
wherein the second switch unit comprises a fifth field-effect transistor.

20. The memory circuit according to claim 19, wherein each of the first field-effect transistor, the second field-effect transistor, the third field-effect transistor, the fourth field-effect transistor, and the fifth field-effect transistor includes an oxide semiconductor layer.

21. A memory device comprising:
memory cells of X rows and Y columns, where each of X and Y is a natural number of 2 or more, each of the memory cells having the memory circuit according to claim 15;
a first driver circuit configured to select a column address of a memory cell targeted for data rewriting or reading; and
a second driver circuit configured to select a row address of the memory cell targeted for data rewriting or reading.

* * * * *